US012573433B2

(12) United States Patent
Kim et al.

(10) Patent No.: US 12,573,433 B2
(45) Date of Patent: Mar. 10, 2026

(54) VOLTAGE GENERATION CIRCUIT AND SEMICONDUCTOR DEVICE FOR DRIVING AN INTERNAL VOLTAGE

(71) Applicant: SK hynix Inc., Icheon-si (KR)

(72) Inventors: Seon Hong Kim, Icheon-si (KR); Kyeong Tae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 217 days.

(21) Appl. No.: 18/437,481

(22) Filed: Feb. 9, 2024

(65) Prior Publication Data

US 2025/0157498 A1     May 15, 2025

(30) Foreign Application Priority Data

Nov. 9, 2023     (KR) ......................... 10-2023-0154792

(51) Int. Cl.
*G11C 5/14*          (2006.01)
*G11C 7/06*          (2006.01)
(52) U.S. Cl.
CPC .............. *G11C 5/147* (2013.01); *G11C 7/062* (2013.01); *G11C 2207/2227* (2013.01)
(58) Field of Classification Search
CPC . G11C 5/147; G11C 7/062; G11C 2207/2227; G11C 7/065; G11C 7/08; G11C 7/06
USPC ....................................................... 365/226
See application file for complete search history.

(56) References Cited

U.S. PATENT DOCUMENTS

| | | | |
|---|---|---|---|
| 2016/0285372 A1* | 9/2016 | Jang ........................ | G11C 5/147 |
| 2017/0099045 A1* | 4/2017 | Shin ...................... | H03K 17/122 |
| 2019/0096446 A1* | 3/2019 | Lee ......................... | G11C 7/062 |
| 2021/0367594 A1* | 11/2021 | Kim ................... | H03K 17/6877 |
| 2022/0262409 A1 | 8/2022 | Lin et al. | |

FOREIGN PATENT DOCUMENTS

| | | |
|---|---|---|
| KR | 1020180024057 A | 3/2018 |
| KR | 1020180094383 A | 8/2018 |

* cited by examiner

*Primary Examiner* — Amir Zarabian
*Assistant Examiner* — Minh Dinh
(74) *Attorney, Agent, or Firm* — WILLIAM PARK AND ASSOCIATES LTD.

(57)     ABSTRACT

A voltage generation circuit includes a voltage control circuit configured to disable a high voltage driving signal, after generating a low voltage driving signal and the high voltage driving signal by comparing a reference voltage and an internal voltage after the start of a mismatching cancellation operation and a sensing operation, and a voltage supply circuit including a first driver having a first driving power and a second driver having a second driving power and configured to drive the internal voltage by selectively activating the first driver and the second driver based on the low voltage driving signal and the high voltage driving signal.

24 Claims, 15 Drawing Sheets

VOLTAGE GENERATION CIRCUIT AND SEMICONDUCTOR DEVICE FOR DRIVING AN INTERNAL VOLTAGE

CROSS-REFERENCE TO RELATED APPLICATION

The present application claims priority under 35 U.S.C. § 119(a) to Korean Patent Application No. 10-2023-0154792, filed in the Korean Intellectual Property Office on Nov. 9, 2023, the entire disclosure of which is incorporated herein by reference.

BACKGROUND

1. Technical Field

The present disclosure generally relates to a semiconductor device, and more particularly, a semiconductor device related to an overcharging phenomenon.

2. Background

In general, a semiconductor device generates and uses an internal voltage that is necessary for an internal operation by being supplied with a source voltage VDD and a ground voltage VSS from the outside. Voltages that are necessary for the internal operation of the semiconductor device include a core voltage VCORE that is supplied to the core region of a memory circuit, a high voltage VPP that drives a word line or that is used after the start of overdriving, and a back bias voltage VBB that is supplied as a bulk voltage of an NMOS transistor of the core region.

With the development of the technology, an interval between a pair of bit lines that are connected to a memory cell of a semiconductor device becomes very narrow. The reliability of data that is input and output becomes problematic because the voltage levels of pairs of adjacent bit lines are changed in response to a change in the voltage levels of the pairs of bit lines. In order to solve the problem, the reliability of data is secured by performing a mismatching cancellation operation of identically driving the voltage levels of a pair of bit lines after the start of an active operation and then inputting and outputting data through a sensing operation.

SUMMARY

In an embodiment, a voltage generation circuit may include a voltage control circuit configured to disable a high voltage driving signal, after generating a low voltage driving signal and the high voltage driving signal by comparing a reference voltage and an internal voltage after the start of a mismatching cancellation operation and a sensing operation, and a voltage supply circuit including a first driver having a first driving power and a second driver having a second driving power and configured to drive the internal voltage by selectively activating the first driver and the second driver based on the low voltage driving signal and the high voltage driving signal.

In an embodiment, a semiconductor device may include a voltage supply circuit configured to drive an internal voltage with a first driving power, after driving the internal voltage with the sum of the first driving power and a second driving power after the start of a mismatching cancellation operation and a sensing operation, and a sense amplifier configured to drive a bit line and an inverted bit line at an identical voltage level by being supplied with the internal voltage in the mismatching cancellation operation and configured to detect and amplify a difference between the voltage levels of the bit line and the inverted bit line by being supplied with the internal voltage in the sensing operation.

In an embodiment, a voltage generation method may include supplying an internal voltage by selectively activating a first driver having first driving power and a second driver having second driving power after the start of a mismatching cancellation operation, driving a bit line and an inverted bit line at an identical voltage level by being supplied with the internal voltage, supplying the internal voltage by selectively activating the first driver and the second driver after the start of a sensing operation, and a sensing operation step of detecting and amplifying a difference between the voltage levels of the bit line and the inverted bit line by being supplied with the internal voltage.

In an embodiment, a semiconductor device may include a voltage supply circuit including a first driver having a first driving power, a second driver having a second driving power, and a third driver having a third driving power and configured to adjust a driving power that drives an internal voltage by selectively activating the first to third drivers based on first to third operation information signals, and a memory circuit configured to operate based on the first to third operation information signals. The memory circuit may be configured to perform a mismatching cancellation operation of driving a bit line and an inverted bit line at an identical voltage level by being supplied with the internal voltage and then perform a sensing operation of outputting data by detecting and amplifying a difference between the voltage levels of a bit line and an inverted bit line by being supplied with the internal voltage.

BRIEF DESCRIPTION OF THE DRAWINGS

FIG. 3 is a block diagram illustrating a construction according to an embodiment of a voltage control circuit that is included in a voltage generation circuit of the semiconductor device illustrated in FIG. 1.

FIG. 10 is a block diagram illustrating a construction of a semiconductor device according to another embodiment of the present disclosure.

FIG. 11 is a block diagram illustrating a construction according to an embodiment of a voltage control circuit that is included in a voltage generation circuit of the semiconductor device illustrated FIG. 10.

FIGS. 12 to 14 are diagrams for describing an operation of the semiconductor device according to another embodiment of the present disclosure.

FIG. 15 is a diagram illustrating a construction according to an embodiment of an electronic system to which the semiconductor device illustrated in FIGS. 1 to 14 has been applied.

DETAILED DESCRIPTION

Figure 1:
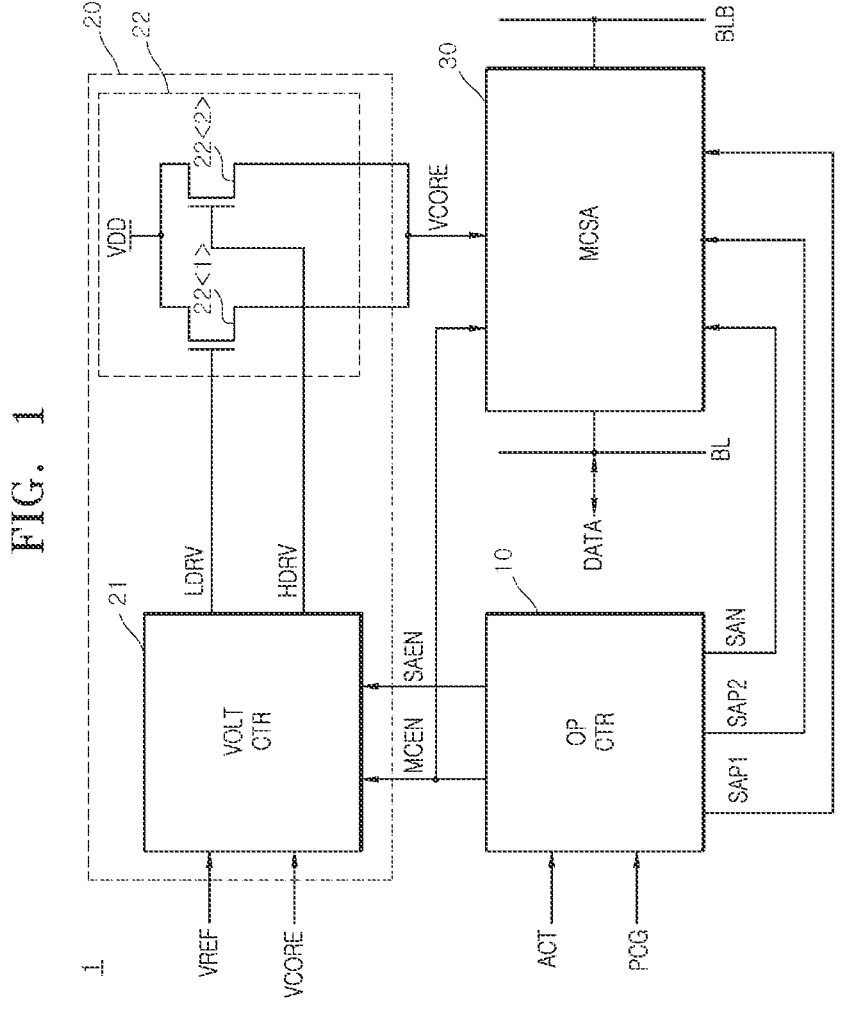
FIG. 1 is a block diagram illustrating a construction of a semiconductor device according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa. These terms are only used to distinguish one element from another element, but not used to define only the element itself or to mean a particular sequence.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

Various embodiments of the present disclosure may provide a voltage generation circuit and a semiconductor device for preventing or mitigating an overcharging phenomenon in which an internal voltage is generated to have a higher voltage level than a target level when a sensing operation is entered by driving the internal voltage with small driving power in a mismatching cancellation operation before the sensing operation is entered.

According to an embodiment of the present disclosure, it is possible to prevent or mitigate an error of a sensing operation because an overcharging phenomenon in which an internal voltage VCORE is generated to have a higher voltage level than a target level does not occur when the sensing operation is entered, by driving the internal voltage VCORE with small driving power in a mismatching cancellation operation before the sensing operation is entered.

Furthermore, according to an embodiment of the present disclosure, it is possible to rapidly raise the voltage level of the internal voltage VCORE by driving the internal voltage VCORE with the sum of first driving power and second driving power when a mismatching cancellation operation and a sensing operation are entered.

Furthermore, according to an embodiment of the present disclosure, it is possible to prevent or mitigate an error of a next sensing operation that is subsequently performed because an overcharging phenomenon in which the internal voltage VCORE is generated to have a higher voltage level than a target level does not occur when the next sensing operation is entered, by driving the internal voltage VCORE with small driving power in a sensing operation.

Furthermore, in an embodiment, it is possible to prevent or mitigate an error of a sensing operation that is performed in another adjacent sense amplifier because an overcharging phenomenon in which the internal voltage VCORE is generated to have a higher voltage level than a target level does not occur when the another adjacent sense amplifier enters a sensing operation, by driving the internal voltage VCORE with small driving power in a sensing operation.

As illustrated in FIG. 1, a semiconductor device 1 according to an embodiment of the present disclosure may include an operation control circuit (OP CTR) 10, a voltage generation circuit 20, and a sense amplifier (MCSA) 30.

The operation control circuit 10 may generate a mismatching enable signal MCEN and a sensing enable signal SAEN based on an active command ACT and a precharge command PCG. The mismatching enable signal MCEN may be a signal for performing a mismatching cancellation operation. The sensing enable signal SAEN may be a signal for performing a sensing operation. The operation control circuit 10 may generate the mismatching enable signal MCEN when the active command ACT is enabled and the precharge command PCG is disabled. The operation control circuit 10 may generate the sensing enable signal SAEN after generating the mismatching enable signal MCEN when the active command ACT is enabled and the precharge command PCG is disabled.

The operation control circuit 10 may generate a first operation pulse SAP1, a second operation pulse SAP2, and a third operation pulse SAN, based on the active command ACT and the precharge command PCG. The operation control circuit 10 may generate the first operation pulse SAP1 and the third operation pulse SAN when the active command ACT is enabled and the mismatching enable signal MCEN is enabled. The operation control circuit 10 may generate the second operation pulse SAP2 and the third operation pulse SAN when the active command ACT is enabled and the sensing enable signal SAEN is enabled.

The voltage generation circuit 20 may include a voltage control circuit (VOLT CTR) 21 and a voltage supply circuit 22.

The voltage control circuit 21 may generate a low voltage driving signal LDRV and a high voltage driving signal HDRV, when the mismatching enable signal MCEN is enabled and a mismatching cancellation operation is entered. After the mismatching cancellation operation is entered, the voltage control circuit 21 may generate the low voltage driving signal LDRV and the high voltage driving signal HDRV by comparing a reference voltage VREF to an internal voltage VCORE. The voltage control circuit 21 may generate the low voltage driving signal LDRV and the high voltage driving signal HDRV that are enabled when the voltage level of the internal voltage VCORE is lower than the voltage level of the reference voltage VREF. The voltage control circuit 21 may generate the high voltage driving signal HDRV that is disabled after generating the low voltage driving signal LDRV and the high voltage driving signal HDRV that are enabled when the mismatching enable signal MCEN is enabled.

The voltage control circuit 21 may generate the low voltage driving signal LDRV and the high voltage driving signal HDRV, when the sensing enable signal SAEN is enabled and a sensing operation is entered. The voltage control circuit 21 may generate the low voltage driving signal LDRV and the high voltage driving signal HDRV by comparing the reference voltage VREF and the internal voltage VCORE after the sensing operation is entered. The voltage control circuit 21 may generate the low voltage driving signal LDRV and the high voltage driving signal HDRV that are enabled when the voltage level of the internal voltage VCORE is lower than the voltage level of the reference voltage VREF. The voltage control circuit 21 may generate the high voltage driving signal HDRV that is disabled after generating the low voltage driving signal LDRV and the high voltage driving signal HDRV that are enabled when the sensing enable signal SAEN is enabled.

The voltage supply circuit 22 may include a first driver 22<1> having first driving power and a second driver 22<2> having second driving power. The first driver 22<1> may be implemented as an NMOS transistor. The first driver 22<1> may be activated when the low voltage driving signal LDRV is enabled to a logic high level, and may drive the internal voltage VCORE with the first driving power by being supplied with a source voltage VDD. The second driver 22<2> may be implemented as an NMOS transistor. The second driver 22<2> may be activated when the high voltage driving signal HDRV is enabled to a logic high level, and may drive the internal voltage VCORE with the second driving power by being supplied with the source voltage VDD. The second driving power may be set as greater driving power that drives the internal voltage VCORE than the first driving power. The second driver 22<2> may be implemented as an NMOS transistor having a larger size than the NMOS transistor of the first driver 22<1>. The first driver 22<1> and the second driver 22<2> may each be implemented as a PMOS transistor according to an embodiment.

The voltage supply circuit 22 may drive the internal voltage VCORE with the sum of the first driving power and the second driving power when a mismatching cancellation operation and a sensing operation are entered. The voltage supply circuit 22 may drive the internal voltage VCORE with the first driving power after driving the internal voltage VCORE with the sum of the first driving power and the second driving power after the start of a mismatching cancellation operation and a sensing operation.

The sense amplifier 30 may be connected between a bit line BL and an inverted bit line BLB. The sense amplifier 30 may drive the bit line BL and the inverted bit line BLB at the same voltage level by being supplied with the internal voltage VCORE in a mismatching cancellation operation. The sense amplifier 30 may drive the bit line BL and the inverted bit line BLB at the same voltage level by being supplied with the internal voltage VCORE based on the first operation pulse SAP1 and the third operation pulse SAN when the mismatching enable signal MCEN is enabled in a mismatching cancellation operation. The sense amplifier 30 may detect and amplify a difference between the voltage levels of the bit line BL and the inverted bit line BLB by being supplied with the internal voltage VCORE in a sensing operation. The sense amplifier 30 may detect and amplify a difference between the voltage levels of the bit line BL and the inverted bit line BLB by being supplied with the internal voltage VCORE based on the second operation pulse SAP2 and the third operation pulse SAN when the mismatching enable signal MCEN is disabled in a sensing operation. The sense amplifier 30 may detect and amplify a difference between the voltage levels of the bit line BL and the inverted bit line BLB by being supplied with the internal voltage VCORE in a sensing operation, may store data DATA that have been loaded onto the bit line BL, and may output the stored data DATA to the bit line BL. The sense amplifier 30 illustrated in FIG. 1 has been illustrated as being one component, but a plurality of sense amplifiers may be implemented to be adjacently disposed.

The semiconductor device 1 may rapidly raise the voltage level of the internal voltage VCORE by driving the internal voltage VCORE with the sum of the first driving power and the second driving power, when the active command ACT is enabled and a mismatching cancellation operation is entered. In an embodiment, the voltage level of the internal voltage VCORE is rapidly raised by driving the internal voltage VCORE with the sum of the first driving power and the second driving power as opposed to simply raising the internal voltage VCORE by driving the internal voltage VCORE with either the first driving power or the second driving power. The semiconductor device 1 may drive the bit line BL and the inverted bit line BLB at the same voltage level by being supplied with the internal voltage VCORE that is rapidly raised by the sum of the first driving power and the second driving power, after the active command ACT is enabled and a mismatching cancellation operation is entered. The semiconductor device 1 may drive the internal voltage VCORE with the sum of the first driving power and the second driving power and then drive the internal voltage VCORE with the first driving power, after the active command ACT is enabled and a mismatching cancellation operation is entered. The semiconductor device 1 may drive the bit line BL and the inverted bit line BLB at the same voltage level by being supplied with the internal voltage VCORE that is driven with the first driving power, after the active command ACT is enabled and a mismatching cancellation operation is entered.

The semiconductor device 1 may rapidly raise the voltage level of the internal voltage VCORE by driving the internal voltage VCORE with the sum of the first driving power and the second driving power when a sensing operation is entered after a mismatching cancellation operation. The semiconductor device 1 may detect and amplify a difference between the voltage levels of the bit line BL and the inverted bit line BLB by being supplied with the internal voltage VCORE that is rapidly raised with the sum of the first driving power and the second driving power, in a sensing operation after a mismatching cancellation operation. The semiconductor device 1 may drive the internal voltage VCORE with the first driving power after driving the internal voltage VCORE with the sum of the first driving power and the second driving power in a sensing operation after a mismatching cancellation operation. The semiconductor device 1 may detect and amplify a difference between the voltage levels of the bit line BL and the inverted bit line BLB by being supplied with the internal voltage VCORE that is driven with the first driving power, in a sensing operation after a mismatching cancellation operation.

In an embodiment, the semiconductor device 1 can prevent or mitigate an error of a sensing operation because an overcharging phenomenon in which the internal voltage VCORE is generated to have a higher voltage level than a target level does not occur when the sensing operation is entered, by driving the internal voltage VCORE with the first driving power in a mismatching cancellation operation before the sensing operation is entered. In an embodiment, the semiconductor device 1 can prevent or mitigate an error of a next sensing operation because an overcharging phenomenon in which the internal voltage VCORE is generated to have a higher voltage level than a target level does not occur when the next sensing operation is entered, by driving the internal voltage VCORE with the first driving power in a sensing operation. In an embodiment, the semiconductor device 1 can prevent or mitigate an error of a sensing operation that is performed in another adjacent sense amplifier because an overcharging phenomenon in which the internal voltage VCORE is generated to have a higher voltage level than a target level does not occur when the another adjacent sense amplifier enters the sensing operation, by driving the internal voltage VCORE with the first driving power in the sensing operation.

Figure 2:
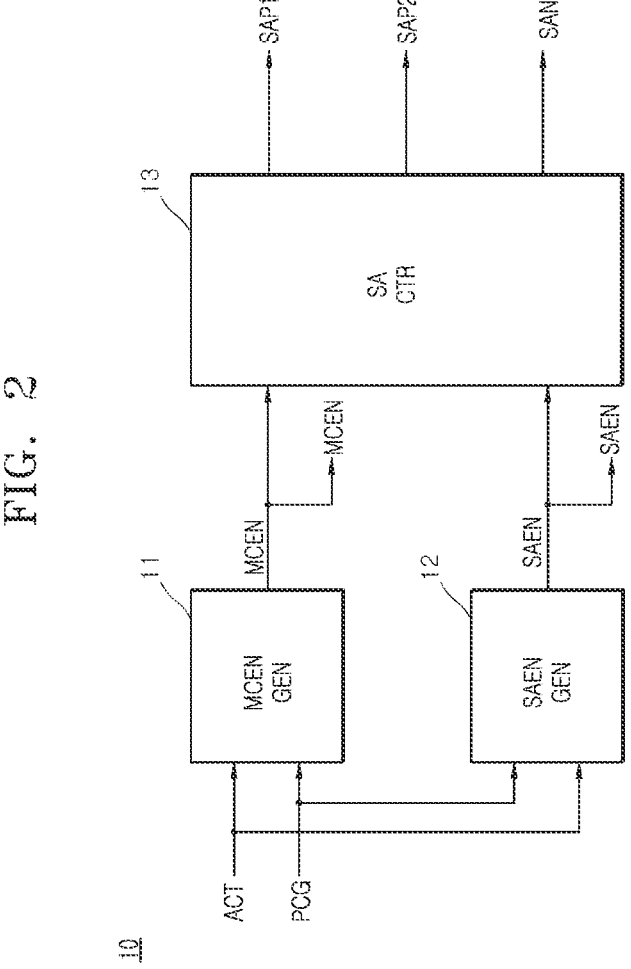
FIG. 2 is a block diagram illustrating a construction according to an embodiment of an operation control circuit that is included in the semiconductor device illustrated in FIG. 1.

FIG. 2 is a block diagram illustrating a construction according to an embodiment of the operation control circuit 10 that is included in the semiconductor device 1. The operation control circuit 10 may include a mismatching enable signal generation circuit (MCEN GEN) 11, a sensing enable signal generation circuit (SAEN GEN) 12, and a sense amplifier control circuit (SA CTR) 13.

The mismatching enable signal generation circuit 11 may generate the mismatching enable signal MCEN for performing a mismatching cancellation operation based on the active command ACT and the precharge command PCG. The mismatching enable signal generation circuit 11 may generate the mismatching enable signal MCEN when the active command ACT is enabled and the precharge command PCG is disabled.

The sensing enable signal generation circuit 12 may generate the sensing enable signal SAEN for performing a sensing operation based on the active command ACT and the precharge command PCG. The sensing enable signal generation circuit 12 may generate the sensing enable signal SAEN after the active command ACT is enabled, the precharge command PCG is disabled, and a mismatching cancellation operation is completed.

The sense amplifier control circuit 13 may generate the first operation pulse SAP1 and the third operation pulse SAN that are enabled when the mismatching enable signal MCEN is enabled. The sense amplifier control circuit 13 may generate the first operation pulse SAP1 and the third operation pulse SAN that are enabled to a logic high level during an interval in which the mismatching enable signal MCEN is enabled. The sense amplifier control circuit 13 may generate the second operation pulse SAP2 and the third operation pulse SAN that are enabled when the sensing enable signal SAEN is enabled. The sense amplifier control circuit 13 may generate the second operation pulse SAP2 and the third operation pulse SAN that are enabled to a logic high level during an interval in which the sensing enable signal SAEN is enabled.

Figure 3:
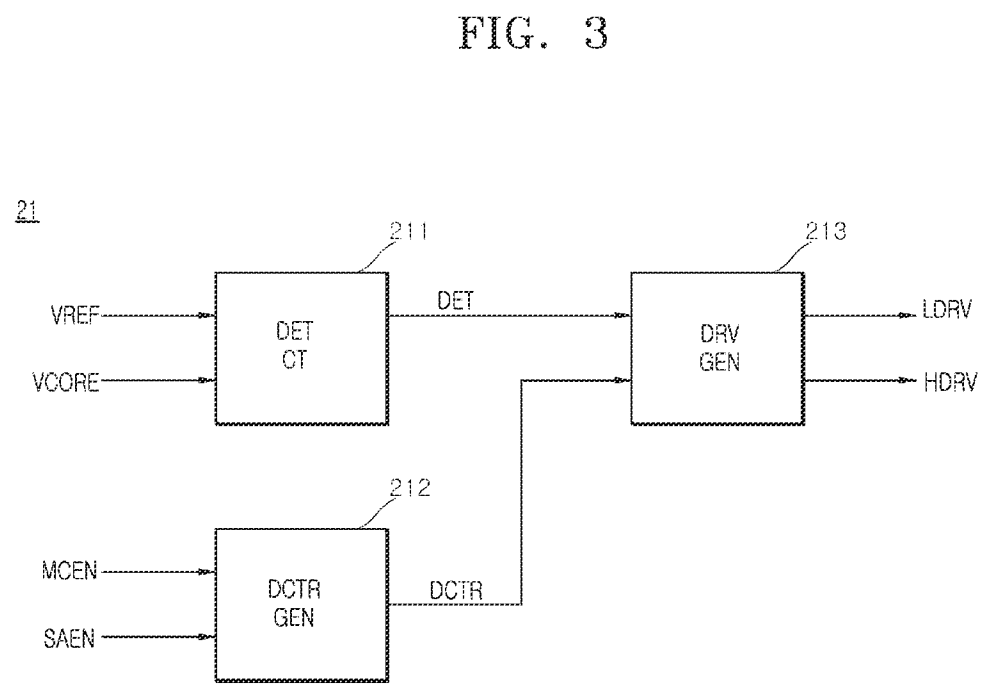

FIG. 3 is a block diagram illustrating a construction according to an embodiment of the voltage control circuit 21 that is included in the voltage generation circuit 20. The voltage control circuit 21 may include a detection circuit (DET CT) 211, a driving control signal generation circuit (DCTR GEN) 212, and a driving signal generation circuit (DRV GEN) 213.

The detection circuit 211 may generate a detection signal DET by comparing the reference voltage VREF and the internal voltage VCORE. The detection circuit 211 may generate the detection signal DET that is enabled to a logic high level when the voltage level of the internal voltage VCORE is lower than the voltage level of the reference voltage VREF. The detection circuit 211 may generate the detection signal DET that is disabled to a logic low level when the voltage level of the internal voltage VCORE is identical with or higher than the voltage level of the reference voltage VREF. The detection circuit 211 may be implemented as a common comparator.

The driving control signal generation circuit 212 may generate a driving control signal DCTR based on the mismatching enable signal MCEN and the sensing enable signal SAEN. The driving control signal generation circuit 212 may generate the driving control signal DCTR that is enabled by a first interval when the mismatching enable signal MCEN is enabled. The driving control signal generation circuit 212 may generate the driving control signal DCTR that is enabled by a second interval when the sensing enable signal SAEN is enabled. The second interval may mean a pulse width larger than the pulse width of the first interval.

The driving signal generation circuit 213 may generate the low voltage driving signal LDRV and the high voltage driving signal HDRV based on the detection signal DET and the driving control signal DCTR. The driving signal generation circuit 213 may generate the low voltage driving signal LDRV that is enabled during an interval in which the detection signal DET is enabled. The driving signal generation circuit 213 may generate the high voltage driving signal HDRV that is enabled by the first interval or the second interval based on the driving control signal DCTR during an interval in which the detection signal DET is enabled. The driving signal generation circuit 213 may generate the high voltage driving signal HDRV by buffering the driving control signal DCTR that is enabled by the first interval during an interval in which the detection signal DET is enabled. The driving signal generation circuit 213 may generate the high voltage driving signal HDRV by buffering the driving control signal DCTR that is enabled by the second interval during an interval in which the detection signal DET is enabled. The driving signal generation circuit 213 may generate the high voltage driving signal HDRV that is disabled after generating the detection signal DET and the driving control signal DCTR that are enabled.

Figure 4:
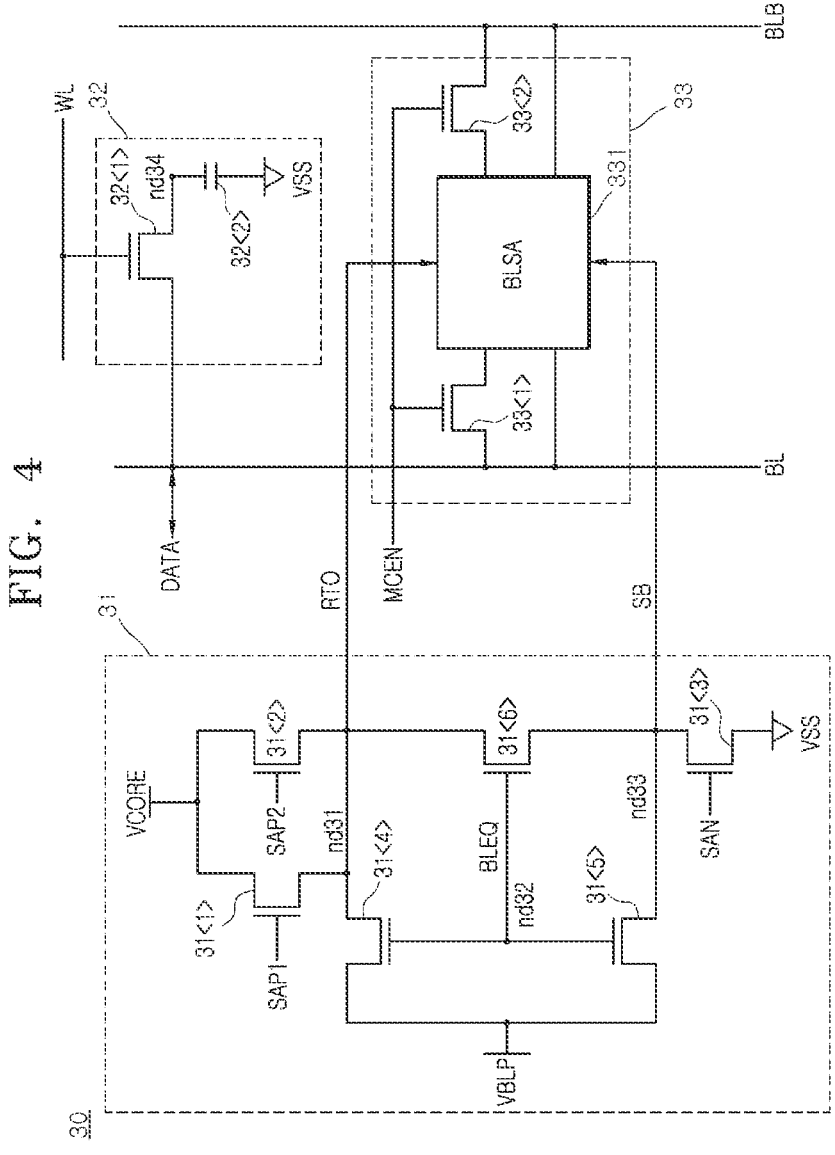
FIG. 4 a diagram illustrating a construction according to an embodiment of a sense amplifier that is included in the semiconductor device illustrated in FIG. 1.

FIG. 4 is a diagram illustrating a construction according to an embodiment of the sense amplifier 30 that is included in the semiconductor device 1. The sense amplifier 30 may include a supply voltage generation circuit 31, a memory cell 32, and an amplification circuit 33.

The supply voltage generation circuit 31 may be implemented by using an NMOS transistor 31<1> that is connected between the internal voltage VCORE and a node nd31, an NMOS transistor 31<2> that is connected between the internal voltage VCORE and the node nd31, an NMOS transistor 31<3> that is connected between a node nd33 and a ground voltage VSS, an NMOS transistor 31<4> that is connected between a precharge voltage VBLP and the node nd31, an NMOS transistor 31<5> that is connected between the precharge voltage VBLP and the node nd33, and an NMOS transistor 31<6> that is connected between the node nd31 and the node nd33.

The supply voltage generation circuit 31 may drive the node nd31 at the voltage level of the internal voltage VCORE by being supplied with the internal voltage VCORE as the NMOS transistor 31<1> is activated when the first operation pulse SAP1 has a logic high level in a mismatching cancellation operation. The supply voltage generation circuit 31 may generate a first supply voltage RTO having the voltage level of the internal voltage VCORE as the NMOS transistor 31<1> is activated when the first operation pulse SAP1 has a logic high level in a mismatching cancellation operation. The supply voltage generation circuit 31 may drive the node nd33 at the voltage level of the ground voltage VSS by being supplied with the ground voltage VSS as the NMOS transistor 31<3> is activated when the third operation pulse SAN has a logic high level in a mismatching cancellation operation. The supply voltage generation circuit 31 may generate a second supply voltage SB having the voltage level of the ground voltage VSS as the NMOS transistor 31<3> is activated when the third operation pulse SAN has a logic high level in a mismatching cancellation operation.

The supply voltage generation circuit 31 may drive the node nd31 at the voltage level of the internal voltage VCORE by being supplied with the internal voltage VCORE as the NMOS transistor 31<2> is activated when the second operation pulse SAP2 has a logic high level in a sensing operation. The supply voltage generation circuit 31 may generate the first supply voltage RTO having the voltage level of the internal voltage VCORE as the NMOS transistor 31<2> is activated when the second operation pulse SAP2 has a logic high level in a sensing operation. The supply voltage generation circuit 31 may drive the node nd33 at the voltage level of the ground voltage VSS by being supplied with the ground voltage VSS as the NMOS transistor 31<3> is activated when the third operation pulse SAN has a logic high level in a sensing operation. The supply voltage generation circuit 31 may generate the second supply voltage SB having the voltage level of the ground voltage VSS as the NMOS transistor 31<3> is activated when the third operation pulse SAN has a logic high level in a sensing operation.

The supply voltage generation circuit 31 may drive the node nd31 and the node nd33 to each having the voltage level of the precharge voltage VBLP by being supplied with the precharge voltage VBLP as the NMOS transistor 31<4>, the NMOS transistor 31<5>, and the NMOS transistor 31<6> are activated when an equalization signal BLEQ has a logic high level in a precharge operation. The supply voltage generation circuit 31 may generate the first supply voltage RTO having the voltage level of the precharge voltage VBLP as the NMOS transistor 31<4>, the NMOS transistor 31<5>, and the NMOS transistor 31<6> are activated when the equalization signal BLEQ has a logic high level in a precharge operation. The supply voltage generation circuit 31 may generate the second supply voltage SB having the voltage level of the precharge voltage VBLP as the NMOS transistor 31<4>, the NMOS transistor 31<5>, and the NMOS transistor 31<6> are activated when the equalization signal BLEQ has a logic high level in a precharge operation.

The memory cell 32 may be connected between a word line WL and a bit line BL. The memory cell 32 may be implemented by an NMOS transistor 32<1> that is connected between the bit line BL and a node nd34 and a capacitor 32<2> that is connected between the node nd34 and the ground voltage VSS. The NMOS transistor 32<1> may connect the bit line BL and the node nd34 when the word line WL is activated. The capacitor 32<2> may store charges of the node nd34.

The memory cell 32 may be connected to the bit line BL and the node nd34 when the word line WL is activated, and may supply charges of the bit line BL to the node nd34 or supply charges of the node nd34 to the bit line BL. The memory cell 32 may store data DATA that have been loaded onto the bit line BL or output the stored data to the bit line BL by performing a charge sharing operation of sharing charges between the bit line BL and the node nd34 when the word line WL is activated.

The amplification circuit 33 may be implemented by a bit line sense amplifier (BLSA) 331 that is connected between the bit line BL and the inverted bit line BLB, a first connection element 33<1> that is connected between the bit line BL and the bit line sense amplifier 331, and a second connection element 33<2> that is connected between the inverted bit line BLB and the bit line sense amplifier 331. In an embodiment, the first connection element 33<1> and the second connection element 33<2> may each be implemented as an NMOS transistor.

The bit line sense amplifier 331 of the amplification circuit 33 may drive the bit line BL and the inverted bit line BLB at the same voltage level based on the first supply voltage RTO and the second supply voltage SB as the first connection element 33<1> and the second connection element 33<2> are activated when the mismatching enable signal MCEN having a logic high level is input after the start of a mismatching cancellation operation. The bit line sense amplifier 331 of the amplification circuit 33 may detect and amplify a difference between the voltage levels of the bit line BL and the inverted bit line BLB based on the first supply voltage RTO and the second supply voltage SB as the first connection element 33<1> and the second connection element 33<2> are deactivated when the mismatching enable signal MCEN having a logic low level is input after the start of a mismatching cancellation operation.

Figure 5:
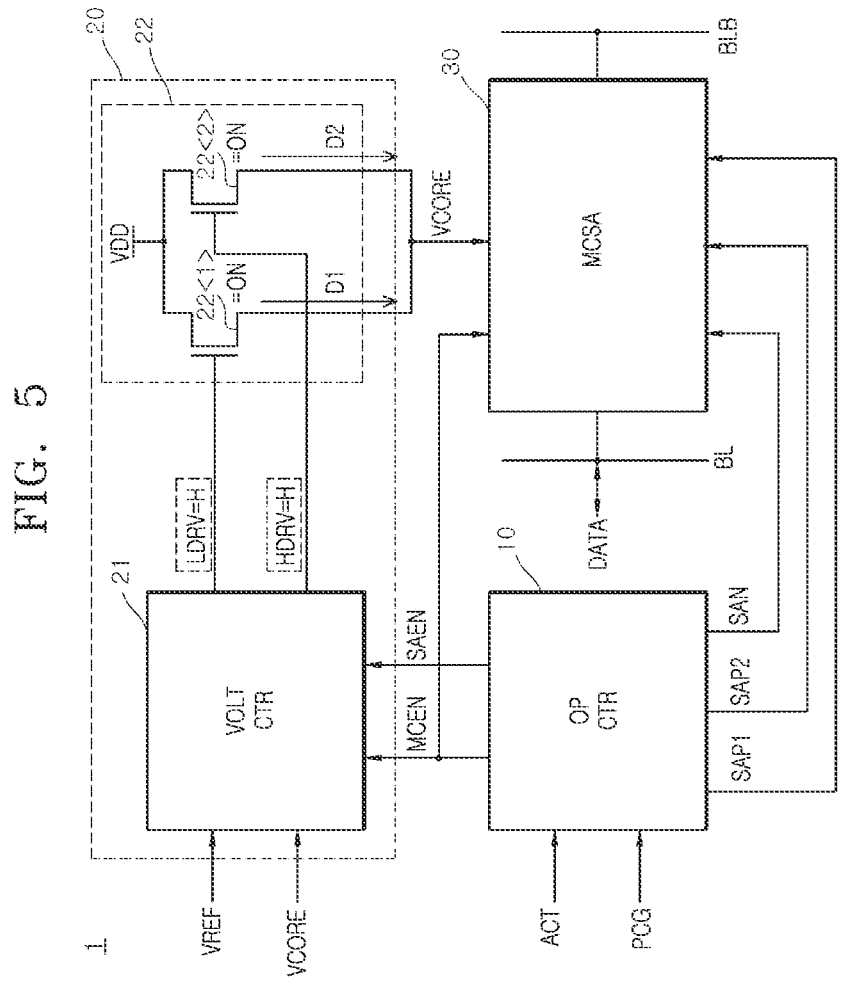
FIGS. 5 and 6 are diagrams for describing an operation of the semiconductor device according to an embodiment of the present disclosure.
Figure 6:
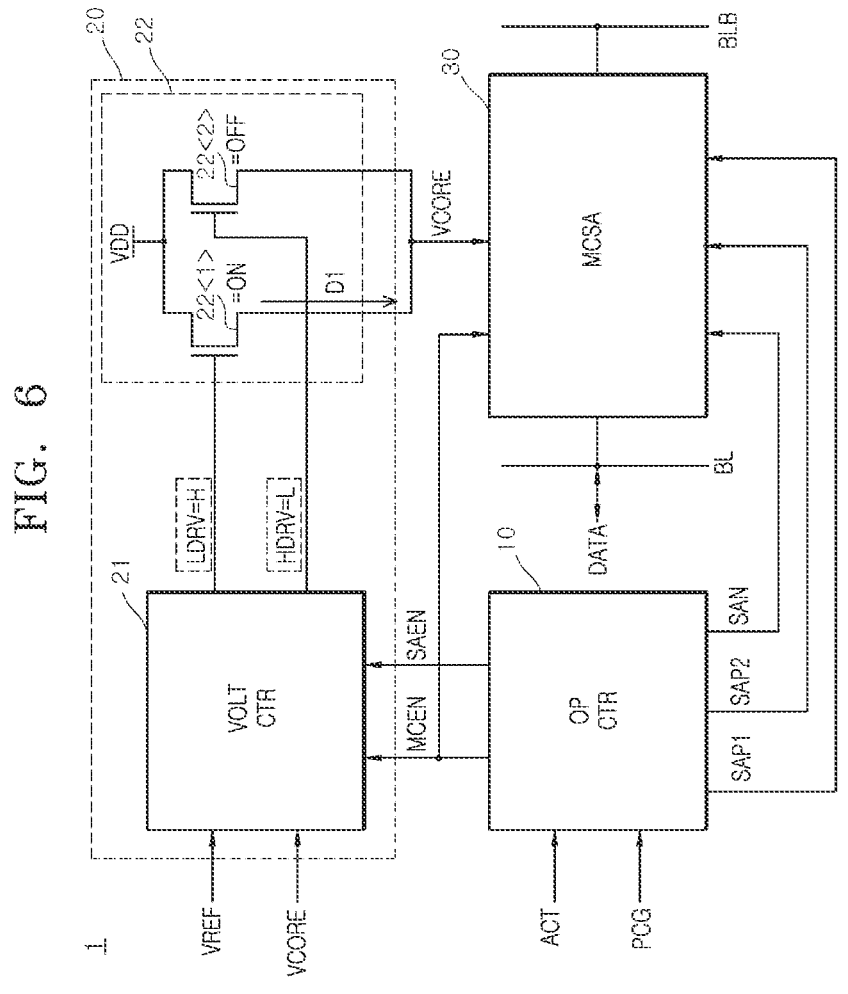

FIGS. 5 and 6 are diagrams for describing an operation of the semiconductor device 1 according to an embodiment of the present disclosure.

First, an operation of the semiconductor device 1 according to an embodiment of the present disclosure will be described with reference to FIG. 5. In this case, an operation of supplying the internal voltage VCORE to the sense amplifier 30 by driving the internal voltage VCORE with the sum of the first driving power D1 and the second driving power D2 when a mismatching cancellation operation and a sensing operation are entered will be described as follows as an example.

The operation control circuit 10 may generate the mismatching enable signal MCEN that is enabled to a logic high level when the active command ACT is enabled and the precharge command PCG is disabled. The operation control circuit 10 may generate the first operation pulse SAP1 having a logic high level and the third operation pulse SAN having a logic high level when the active command ACT is enabled and the mismatching enable signal MCEN is enabled.

The voltage control circuit 21 may generate the low voltage driving signal LDRV having a logic high level H and the high voltage driving signal HDRV having a logic high level H when the voltage level of the internal voltage VCORE is lower than the voltage level of the reference voltage VREF, when the mismatching enable signal MCEN is enabled and a mismatching cancellation operation is entered.

The voltage supply circuit 22 may drive the internal voltage VCORE with the first driving power D1 by being supplied with the source voltage VDD as the first driver 22<1> is activated (ON) when the low voltage driving signal LDRV is enabled to the logic high level H. The voltage supply circuit 22 may drive the internal voltage VCORE with the second driving power D2 by being supplied with the source voltage VDD as the second driver 22<2> is activated (ON) when the high voltage driving signal HDRV is enabled to the logic high level H. The voltage supply circuit 22 may rapidly raise the voltage level of the internal voltage VCORE by driving the internal voltage VCORE with the sum of the first driving power D1 and the second driving power D2 when the mismatching cancellation operation is entered.

The sense amplifier 30 may drive the bit line BL and the inverted bit line BLB at the same voltage level by being supplied with the internal voltage VCORE that is rapidly raised when the mismatching cancellation operation is entered.

That is, the semiconductor device 1 can rapidly raise the voltage level of the internal voltage VCORE by driving the internal voltage VCORE with the sum of the first driving power and the second driving power when the mismatching cancellation operation is entered. The semiconductor device 1 can drive the bit line BL and the inverted bit line BLB at the same voltage level by being supplied with the internal voltage VCORE that is rapidly raised with the sum of the first driving power D1 and the second driving power D2 when the mismatching cancellation operation is entered.

The operation control circuit 10 may generate the sensing enable signal SAEN after generating the mismatching enable signal MCEN when the active command ACT is enabled and the precharge command PCG is disabled. The operation control circuit 10 may generate the second operation pulse SAP2 having a logic high level and the third operation pulse SAN having a logic high level when the active command ACT is enabled and the sensing enable signal SAEN is enabled.

The voltage control circuit 21 may generate the low voltage driving signal LDRV having the logic high level H and the high voltage driving signal HDRV having the logic high level H when the voltage level of the internal voltage VCORE is lower than the voltage level of the reference voltage VREF, when the sensing enable signal SAEN is enabled and a sensing operation is entered.

The voltage supply circuit 22 may drive the internal voltage VCORE with the first driving power D1 by being supplied with the source voltage VDD as the first driver 22<1> is activated (ON) when the low voltage driving signal LDRV is enabled to the logic high level H. The voltage supply circuit 22 may drive the internal voltage VCORE with the second driving power D2 by being supplied with the source voltage VDD as the second driver 22<2> is activated (ON) when the high voltage driving signal HDRV is enabled to the logic high level H. The voltage supply circuit 22 may rapidly raise the voltage level of the internal voltage VCORE by driving the internal voltage VCORE with the sum of the first driving power D1 and the second driving power D2 when the sensing operation is entered.

The sense amplifier 30 may detect and amplify a difference between the voltage levels of the bit line BL and the inverted bit line BLB by being supplied with the internal voltage VCORE that is rapidly raised when the sensing operation is entered, and may store the data DATA that have been loaded onto the bit line BL or may output the stored data DATA to the bit line BL.

That is, the semiconductor device 1 can rapidly raise the voltage level of the internal voltage VCORE by driving the internal voltage VCORE with the sum of the first driving power D1 and the second driving power D2 when the sensing operation is entered. The semiconductor device 1 can detect and amplify a difference between the voltage levels of the bit line BL and the inverted bit line BLB by being supplied with the internal voltage VCORE that is rapidly raised with the sum of the first driving power D1 and the second driving power D2 when the sensing operation is entered, and may store the data DATA that have been loaded onto the bit line BL or may output the stored data DATA to the bit line BL.

Next, an operation of the semiconductor device 1 according to an embodiment of the present disclosure will be described with reference to FIG. 6. In this case, an operation of driving the internal voltage VCORE with the sum of the first driving power D1 and the second driving power D2 when a mismatching cancellation operation and a sensing operation are entered and then supplying the internal voltage VCORE to the sense amplifier 30 by driving the internal voltage VCORE with the first driving power D1 in the mismatching cancellation operation and the sensing operation will be described as follows as an example.

Prior to the description, the operation of driving the internal voltage VCORE with the sum of the first driving power D1 and the second driving power D2 when the mismatching cancellation operation is entered may be the same as the operation described with reference to FIG. 5, and a detailed description thereof will be omitted.

The operation control circuit 10 may generate the mismatching enable signal MCEN that is enabled to a logic high level when the active command ACT is enabled and the precharge command PCG is disabled. The operation control circuit 10 may generate the first operation pulse SAP1 having a logic high level and the third operation pulse SAN having a logic high level when the active command ACT is enabled and the mismatching enable signal MCEN is enabled.

The voltage control circuit 21 may generate the low voltage driving signal LDRV having a logic high level H and the high voltage driving signal HDRV having a logic low level L when the voltage level of the internal voltage VCORE is lower than the voltage level of the reference voltage VREF in the mismatching cancellation operation as the mismatching enable signal MCEN is enabled.

The voltage supply circuit 22 may drive the internal voltage VCORE with the first driving power D1 by being supplied with the source voltage VDD as the first driver 22<1> is activated (ON) when the low voltage driving signal LDRV is enabled to the logic high level H. When the high voltage driving signal HDRV is disabled to the logic low level L, the second driver 22<2> of the voltage supply circuit 22 may be deactivated (OFF). The voltage supply circuit 22 may drive the internal voltage VCORE with the first driving power D1 in the mismatching cancellation operation.

The sense amplifier 30 may drive the bit line BL and the inverted bit line BLB at the same voltage level by being supplied with the internal voltage VCORE that has been driven with the first driving power D1 in the mismatching cancellation operation.

That is, the semiconductor device 1 can drive the internal voltage VCORE with the first driving power D1 in the mismatching cancellation operation. The semiconductor device 1 can drive the bit line BL and the inverted bit line BLB at the same voltage level by being supplied with the internal voltage VCORE that is driven with the first driving power D1 in the mismatching cancellation operation.

Prior to the description, the operation of driving the internal voltage VCORE with the sum of the first driving power D1 and the second driving power D2 when a sensing operation is entered may be the same as the operation described with reference to FIG. 5, and a detailed description thereof will be omitted.

The operation control circuit 10 may generate the sensing enable signal SAEN after generating the mismatching enable signal MCEN when the active command ACT is enabled and the precharge command PCG is disabled. The operation control circuit 10 may generate the second operation pulse SAP2 having a logic high level and the third operation pulse SAN having a logic high level when the active command ACT is enabled and the sensing enable signal SAEN is enabled.

The voltage control circuit 21 may generate the low voltage driving signal LDRV having the logic high level H and the high voltage driving signal HDRV having the logic low level L when the voltage level of the internal voltage VCORE is lower than the voltage level of the reference voltage VREF in the sensing operation as the sensing enable signal SAEN is enabled.

The voltage supply circuit 22 may drive the internal voltage VCORE with the first driving power D1 by being supplied with the source voltage VDD as the first driver 22<1> is activated (ON) when the low voltage driving signal LDRV is enabled to the logic high level H. When the high voltage driving signal HDRV is disabled to the logic low level L, the second driver 22<2> of the voltage supply circuit 22 may be deactivated (OFF). The voltage supply circuit 22 may drive the internal voltage VCORE with the first driving power D1 in the sensing operation.

The sense amplifier 30 may detect and amplify a difference between the voltage levels of the bit line BL and the inverted bit line BLB by being supplied with the internal voltage VCORE that is driven with the first driving power D1 in the sensing operation, and may store the data DATA that have been loaded onto the bit line BL or may output the stored data DATA to the bit line BL.

That is, the semiconductor device 1 can drive the internal voltage VCORE with the first driving power D1 in the sensing operation. The semiconductor device 1 can detect and amplify a difference between the voltage levels of the bit line BL and the inverted bit line BLB by being supplied with the internal voltage VCORE that is driven with the first driving power D1 in the sensing operation, and can store the data DATA that have been loaded onto the bit line BL or may output the stored data DATA to the bit line BL. In an embodiment, the semiconductor device 1 can prevent or mitigate an error of a sensing operation because an overcharging phenomenon in which the internal voltage VCORE is generated to have a higher voltage level than a target level does not occur when the sensing operation is entered, by driving the internal voltage VCORE with the first driving power D1 in a mismatching cancellation operation before the sensing operation is entered. In an embodiment, the semiconductor device 1 can prevent or mitigate an error of a sensing operation because an overcharging phenomenon in which the internal voltage VCORE is generated to have a higher voltage level than a target level does not occur when a next sensing operation is entered, by driving the internal voltage VCORE with the first driving power D1 in the sensing operation.

Figure 7:
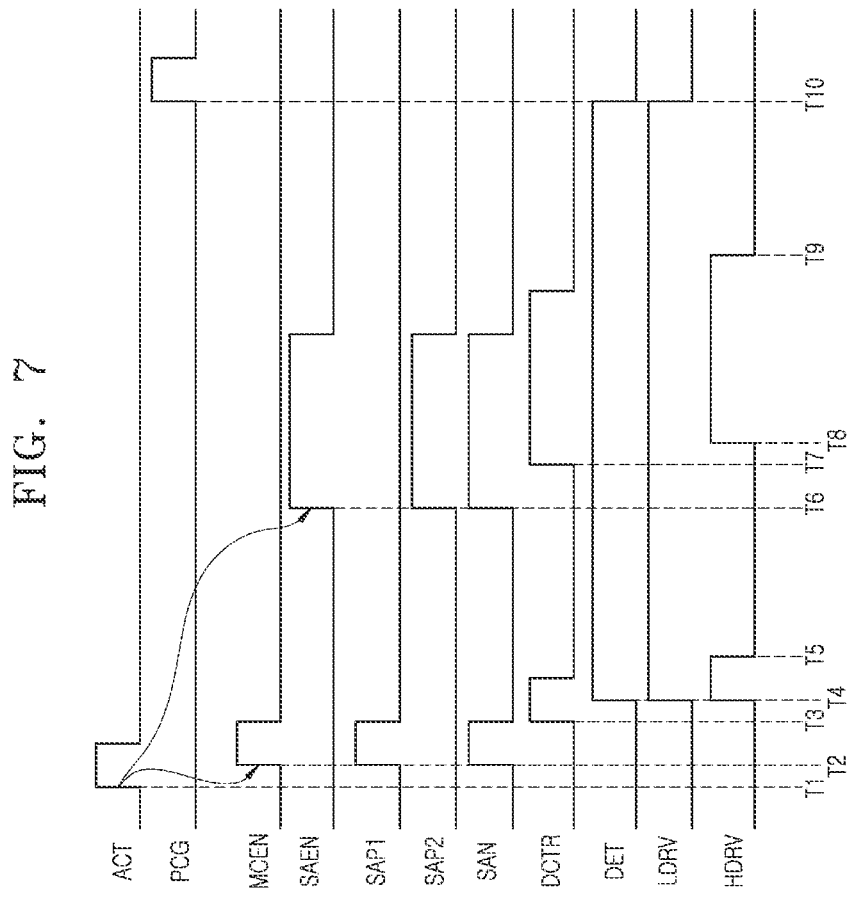
FIGS. 7 and 8 are timing diagrams for describing an operation of the semiconductor device according to an embodiment of the present disclosure.

An operation of the semiconductor device 1 according to an embodiment of the present disclosure will be described with reference to FIG. 7. In this case, an operation of supplying the internal voltage VCORE to the sense amplifier 30 as a mismatching cancellation operation and a sensing operation are sequentially performed will be described as follows.

At timing T1, the active command ACT that is enabled to a logic high level and the precharge command PCG that is disabled to a logic low level may be input to the operation control circuit 10 of the semiconductor device 1.

At timing T2, the mismatching enable signal generation circuit 11 of the operation control circuit 10 may generate the mismatching enable signal MCEN that is enabled to a logic high level when the active command ACT that has been input at timing T1 is enabled to a logic high level and the precharge command PCG that has been input at timing T1 is disabled to a logic low level. The sense amplifier control circuit 13 of the operation control circuit 10 may generate the third operation pulse SAN that is enabled to a logic high level and the first operation pulse SAP1 that is enabled to a logic high level when the mismatching enable signal MCEN is enabled.

At timing T3, the driving control signal generation circuit 212 of the voltage control circuit 21 may generate the driving control signal DCTR that is enabled for a first interval or duration when the mismatching enable signal MCEN is enabled.

At timing T4, the detection circuit 211 of the voltage control circuit 21 may generate the detection signal DET that is enabled to a logic high level when the voltage level of the internal voltage VCORE is lower than the voltage level of the reference voltage VREF. The driving signal generation circuit 213 of the voltage control circuit 21 may generate the low voltage driving signal LDRV that is enabled during an interval in which the detection signal DET is enabled. The driving signal generation circuit 213 of the voltage control circuit 21 may generate the high voltage driving signal HDRV that is enabled by the first interval by buffering the driving control signal DCTR that has been generated at timing T3 during the interval in which the detection signal DET is enabled.

The first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be activated when the high voltage driving signal HDRV is enabled to a logic high level, and may drive the internal voltage VCORE with the second driving power by being supplied with the source voltage VDD. The voltage supply circuit 22 may drive the internal voltage VCORE with the sum of the first driving power and the second driving power when the mismatching cancellation operation is entered.

The sense amplifier 30 may drive the bit line BL and the inverted bit line BLB at the same voltage level by being supplied with the internal voltage VCORE that has been driven with the sum of the first driving power and the second driving power based on the first operation pulse SAP1 and the third operation pulse SAN when the mismatching enable signal MCEN is enabled in a mismatching cancellation operation.

At timing T5, the driving signal generation circuit 213 of the voltage control circuit 21 may generate the high voltage driving signal HDRV that is disabled to a logic low level.

The first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be deactivated when the high voltage driving signal HDRV is disabled to a logic low level. The voltage supply circuit 22 may drive the internal voltage VCORE with the first driving power in a mismatching cancellation operation.

The sense amplifier 30 may drive the bit line BL and the inverted bit line BLB at the same voltage level by being supplied with the internal voltage VCORE that has been driven with the first driving power based on the first operation pulse SAP1 and the third operation pulse SAN when the mismatching enable signal MCEN is enabled in the mismatching cancellation operation.

At timing T6, the sensing enable signal generation circuit 12 of the operation control circuit 10 may generate the sensing enable signal SAEN that is enabled to a logic high level when a sensing operation is entered, after the mismatching cancellation operation is completed based on the active command ACT that has been input at timing T1. The sense amplifier control circuit 13 of the operation control circuit 10 may generate the second operation pulse SAP2 that is enabled to a logic high level and the third operation pulse SAN that is enabled to a logic high level when the sensing enable signal SAEN is enabled.

At timing T7, the driving control signal generation circuit 212 of the voltage control circuit 21 may generate the driving control signal DCTR that is enabled for a second interval when the sensing enable signal SAEN is enabled.

At timing T8, the driving signal generation circuit 213 of the voltage control circuit 21 may generate the high voltage driving signal HDRV that is enabled by the second interval by buffering the driving control signal DCTR that has been generated at timing T7 during the interval in which the detection signal DET is enabled.

The first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be activated when the high voltage driving signal HDRV is enabled to a logic high level, and may drive the internal voltage VCORE with the second driving power by being supplied with the source voltage VDD. The voltage supply circuit 22 may drive the internal voltage VCORE with the sum of the first driving power and the second driving power when the mismatching cancellation operation is entered.

The sense amplifier 30 may detect and amplify a difference between the voltage levels of the bit line BL and the inverted bit line BLB by being supplied with the internal voltage VCORE that has been driven with the sum of the first driving power and the second driving power based on the second operation pulse SAP2 and the third operation pulse SAN when the mismatching enable signal MCEN is disabled in the sensing operation, and may store the data DATA that have been loaded onto the bit line BL or may output the stored data DATA to the bit line BL.

At timing T9, the driving signal generation circuit 213 of the voltage control circuit 21 may generate the high voltage driving signal HDRV that is disabled to a logic low level.

The first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be deactivated when the high voltage driving signal HDRV is disabled to a logic low level. The voltage supply circuit 22 may drive the internal voltage VCORE with the first driving power in the mismatching cancellation operation.

The sense amplifier 30 may detect and amplify a difference between the voltage levels of the bit line BL and the inverted bit line BLB by being supplied with the internal voltage VCORE that has been driven with the first driving power based on the second operation pulse SAP2 and the third operation pulse SAN when the mismatching enable signal MCEN is disabled in the sensing operation, and may store the data DATA that have been loaded onto the bit line BL or may output the stored data DATA to the bit line BL.

At timing T10, the precharge command PCG having a logic high level may be input to the operation control circuit 10 of the semiconductor device 1.

The supply voltage generation circuit 31 of the sense amplifier 30 may drive the node nd31 and the node nd33 at the voltage level of the precharge voltage VBLP by being supplied with the precharge voltage VBLP as the NMOS transistor 31<4>, the NMOS transistor 31<5>, and the NMOS transistor 31<6> are activated when the equalization signal BLEQ has a logic high level in a precharge operation. The supply voltage generation circuit 31 may generate the first supply voltage RTO having the voltage level of the precharge voltage VBLP as the NMOS transistor 31<4>, the NMOS transistor 31<5>, and the NMOS transistor 31<6> are activated when the equalization signal BLEQ has a logic high level in the precharge operation. The supply voltage generation circuit 31 may generate the second supply voltage SB having the voltage level of the precharge voltage VBLP as the NMOS transistor 31<4>, the NMOS transistor 31<5>, and the NMOS transistor 31<6> are activated when the equalization signal BLEQ has a logic high level in the precharge operation.

Figure 8:
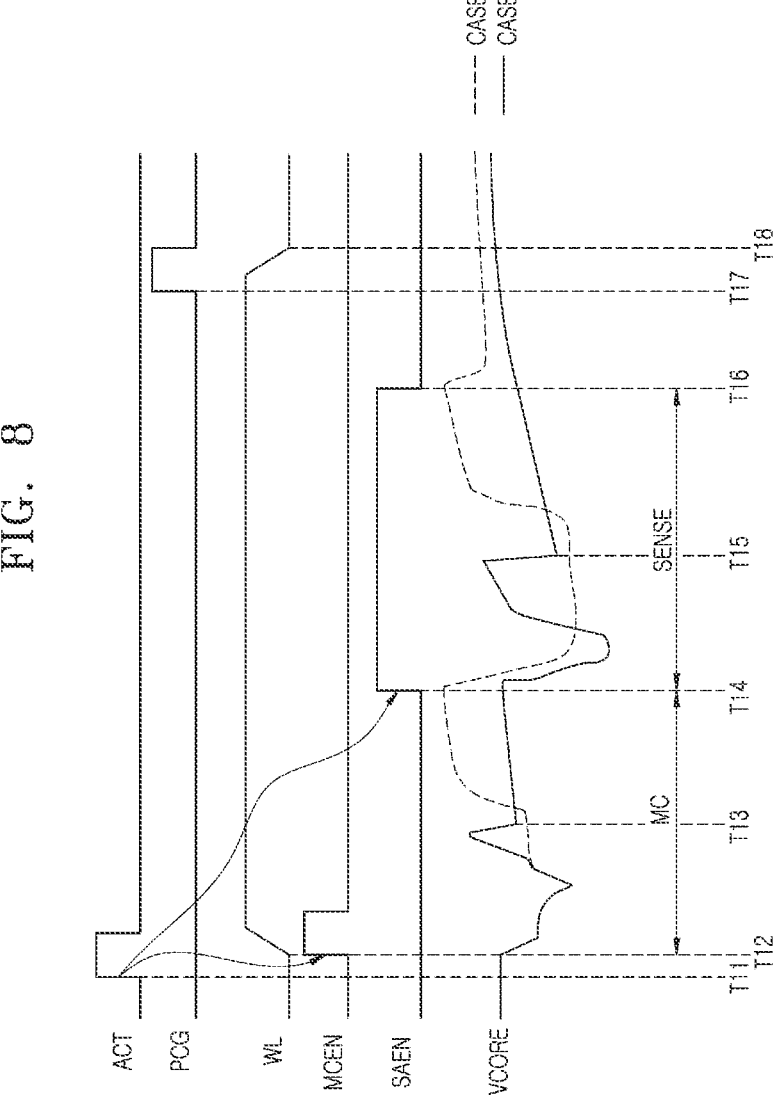

An operation of the semiconductor device 1 according to an embodiment of the present disclosure will be described with reference to FIG. 8. In this case, the voltage level of the internal voltage VCORE when a mismatching cancellation operation and a sensing operation are sequentially performed will be described as follows.

At timing T11, the active command ACT that is enabled to a logic high level and the precharge command PCG that is disabled to a logic low level may be input to the operation control circuit 10 of the semiconductor device 1.

At timing T12, the word line WL may be activated by the active command ACT that has been input at timing T11.

The operation control circuit 10 may generate the mismatching enable signal MCEN that is enabled, at timing T12, to a logic high level when the active command ACT that has been input at timing T11 is enabled to a logic high level and the precharge command PCG that has been input at timing T11 is disabled to a logic low level.

The voltage control circuit 21 of the voltage generation circuit 20 may generate the low voltage driving signal LDRV and the high voltage driving signal HDRV that are enabled when the mismatching enable signal MCEN is enabled.

From timing T12 to timing T13, the first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be activated when the high voltage driving signal HDRV is enabled to a logic high level, and may drive the internal voltage VCORE with the second driving power by being supplied with the source voltage VDD. The voltage supply circuit 22 may drive the internal voltage VCORE with the sum of the first driving power and the second driving power when the mismatching cancellation operation is entered.

The sense amplifier 30 may drive the bit line BL and the inverted bit line BLB at the same voltage level by being supplied with the internal voltage VCORE that has been driven with the sum of the first driving power and the second driving power based on the first operation pulse SAP1 and the third operation pulse SAN when the mismatching enable signal MCEN is enabled in a mismatching cancellation operation.

According to a comparative example (CASE 1=a dotted line), when one comparator drives the internal voltage VCORE by detecting the voltage level of the internal voltage VCORE, current consumption may be increased by a mismatching cancellation operation that is performed in the sense amplifier 30. Accordingly, the internal voltage VCORE having a low voltage level may be generated.

Apart from this, in an embodiment of the present disclosure (CASE 2=a solid line), the voltage level of the internal voltage VCORE may be rapidly raised although current consumption is increased by a mismatching cancellation operation that is performed in the sense amplifier 30 when the internal voltage VCORE is driven with the sum of the first driving power and the second driving power through the first driver 22<1> and the second driver 22<2>.

At timing T13, the voltage control circuit 21 of the voltage generation circuit 20 may generate the low voltage driving signal LDRV that is enabled and the high voltage driving signal HDRV that is disabled in the mismatching cancellation operation.

From timing T13 to timing T14, the first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be deactivated when the high voltage driving signal HDRV is disabled to a logic low level. The voltage supply circuit 22 may drive the internal voltage VCORE with the first driving power in the mismatching cancellation operation.

The sense amplifier 30 may drive the bit line BL and the inverted bit line BLB at the same voltage level by being supplied with the internal voltage VCORE that has been driven with the first driving power based on the first operation pulse SAP1 and the third operation pulse SAN when the mismatching enable signal MCEN is enabled in the mismatching cancellation operation.

According to a comparative example (CASE 1=the dotted line), the internal voltage VCORE having a high voltage level may be generated because an overcharging phenomenon in which the internal voltage VCORE is generated to have a higher voltage level than a target level occurs when one comparator drives the internal voltage VCORE by detecting the voltage level of the internal voltage VCORE.

Apart from this, in an embodiment of the present disclosure (CASE 2=the solid line), an overcharging phenomenon in which the voltage level of the internal voltage VCORE is rapidly raised does not occur when the internal voltage VCORE is driven with the first driving power through the first driver 22<1>.

At timing T14, the operation control circuit 10 may generate the sensing enable signal SAEN that is enabled to a logic high level when a sensing operation is entered after the mismatching cancellation operation is completed based on the active command ACT that has been input at timing T11.

The voltage control circuit 21 of the voltage generation circuit 20 may generate the low voltage driving signal LDRV and the high voltage driving signal HDRV that are enabled when the sensing enable signal SAEN is enabled.

From timing T14 to timing T15, the first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be activated when the high voltage driving signal HDRV is enabled to a logic high level, and may drive the internal voltage VCORE with the second driving power by being supplied with the source voltage VDD. The voltage supply circuit 22 may drive the internal voltage VCORE with the sum of the first driving power and the second driving power when the sensing operation is entered.

The sense amplifier 30 may detect and amplify a difference between the voltage levels of the bit line BL and the inverted bit line BLB by being supplied with the internal voltage VCORE that has been driven with the sum of the first driving power and the second driving power based on the second operation pulse SAP2 and the third operation pulse SAN when the mismatching enable signal MCEN is disabled in the sensing operation, and may store the data DATA that have been loaded onto the bit line BL and may output the stored data DATA to the bit line BL.

According to the comparative example (CASE 1=the dotted line), in the mismatching cancellation operation, an overcharging phenomenon may occur when one comparator drives the internal voltage VCORE by detecting the voltage level of the internal voltage VCORE. Accordingly, an error of the sensing operation may occur because the internal voltage VCORE has a high voltage level prior to timing T15.

Apart from this, according to an embodiment of the present disclosure (CASE 2=the solid line), in the mismatching cancellation operation, an overcharging phenomenon does not occur when the internal voltage VCORE is driven with the first driving power through the first driver 22<1>. Accordingly, in an embodiment, an error of the sensing operation can be prevented or mitigated because the internal voltage VCORE has a low voltage level prior to timing T15.

At timing T15, the voltage control circuit 21 of the voltage generation circuit 20 may generate the low voltage driving signal LDRV that is enabled and the high voltage driving signal HDRV that is disabled in the sensing operation.

From timing T15 to timing T16, the first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be deactivated when the high voltage driving signal HDRV is disabled to a logic low level. The voltage supply circuit 22 may drive the internal voltage VCORE with the first driving power in the mismatching cancellation operation.

The sense amplifier 30 may detect and amplify a difference between the voltage levels of the bit line BL and the inverted bit line BLB by being supplied with the internal voltage VCORE that has been driven with the sum of the first driving power and the second driving power based on the second operation pulse SAP2 and the third operation pulse SAN when the mismatching enable signal MCEN is disabled in the sensing operation, and may store the data DATA that has been loaded onto the bit line BL or may output the stored data DATA to the bit line BL.

According to the comparative example (CASE 1=the dotted line), in the sensing operation, an overcharging phenomenon may occur when one comparator drives the internal voltage VCORE by detecting the voltage level of the internal voltage VCORE. Accordingly, an error of a sensing operation that is subsequently performed may occur because the internal voltage VCORE has a high voltage level.

Apart from this, according to an embodiment of the present disclosure (CASE 2=the solid line), in the sensing operation, an overcharging phenomenon does not occur when the internal voltage VCORE is driven with the first driving power through the first driver 22<1>. In an embodiment, an error of a next sensing operation can be prevented or mitigated because the internal voltage VCORE has a low voltage level.

At timing T17, the precharge command PCG having a logic high level may be input.

At timing T18, the word line WL may be deactivated by the precharge command PCG that has been input at timing T17.

The supply voltage generation circuit 31 of the sense amplifier 30 may drive the node nd31 and the node nd33 at the voltage level of the precharge voltage VBLP by being supplied with the precharge voltage VBLP as the NMOS transistor 31<4>, the NMOS transistor 31<5>, and the NMOS transistor 31<6> are activated when the equalization signal BLEQ has a logic high level in a precharge operation. The supply voltage generation circuit 31 may generate the first supply voltage RTO having the voltage level of the precharge voltage VBLP as the NMOS transistor 31<4>, the NMOS transistor 31<5>, and the NMOS transistor 31<6> are activated when the equalization signal BLEQ has a logic high level in the precharge operation. The supply voltage generation circuit 31 may generate the second supply voltage SB having the voltage level of the precharge voltage VBLP as the NMOS transistor 31<4>, the NMOS transistor 31<5>, and the NMOS transistor 31<6> are activated when the equalization signal BLEQ has a logic high level in the precharge operation.

As described above, the semiconductor device 1 according to an embodiment of the present disclosure can prevent or mitigate an error of a sensing operation because an overcharging phenomenon in which the internal voltage VCORE is generated to have a higher voltage level than a target level does not occur when the sensing operation is entered, by driving the internal voltage VCORE with the first driving power in a mismatching cancellation operation before the sensing operation is entered. In an embodiment, the semiconductor device 1 can prevent or mitigate an error of a next sensing operation because an overcharging phenomenon in which the internal voltage VCORE is generated to have a higher voltage level than a target level does not occur when the next sensing operation is entered, by driving the internal voltage VCORE with the first driving power in a sensing operation. In an embodiment, the semiconductor device 1 can prevent or mitigate an error of a sensing operation that is performed in another adjacent sense amplifier because an overcharging phenomenon in which the internal voltage VCORE is generated to have a higher voltage level than a target level does not occur when the another adjacent sense amplifier enters the sensing operation, by driving the internal voltage VCORE with the first driving power in the sensing operation.

Figure 9:
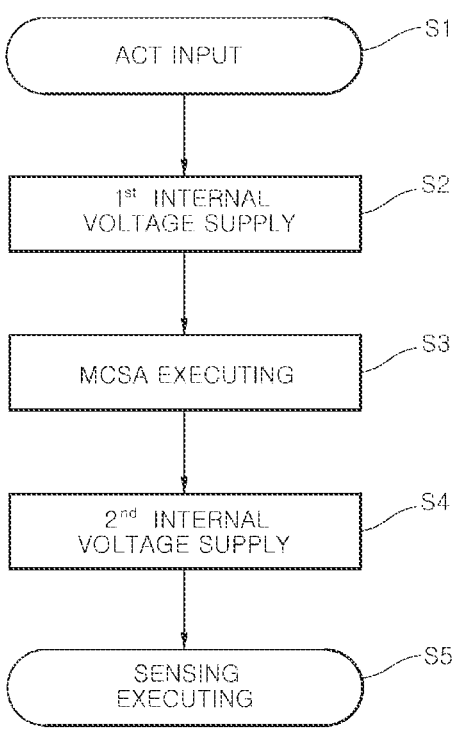
FIG. 9 is a flowchart for describing a voltage generation method according to an embodiment of the present disclosure.

FIG. 9 is a flowchart for describing a voltage generation method according to an embodiment of the present disclosure. Referring to FIG. 9, the voltage generation method according to an embodiment of the present disclosure may include an active command input step S1, a first internal voltage supply step S2, a mismatching cancellation operation step S3, a second internal voltage supply step S4, and a sensing operation step S5.

The active command input step S1 may be set as a step of the active command ACT being input into the operation control circuit 10.

The first internal voltage supply step S2 may be set as a step of supplying the internal voltage VCORE by selectively activating the first driver 22<1> having the first driving power and the second driver 22<2> having the second driving power after the start of a mismatching cancellation operation.

In the first internal voltage supply step S2, the operation control circuit 10 may generate the mismatching enable signal MCEN when the active command ACT is enabled and the precharge command PCG is disabled. The operation control circuit 10 may generate the first operation pulse SAP1 and the third operation pulse SAN when the active command ACT is enabled and the mismatching enable signal MCEN is enabled. The voltage control circuit 21 may generate the low voltage driving signal LDRV and the high voltage driving signal HDRV that are enabled to a logic high level when the voltage level of the internal voltage VCORE is lower than the voltage level of the reference voltage VREF, when the mismatching enable signal MCEN is enabled and the mismatching cancellation operation is entered. The first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be activated when the high voltage driving signal HDRV is enabled to a logic high level, and may drive the internal voltage VCORE with the second driving power by being supplied with the source voltage VDD. The voltage supply circuit 22 may drive the internal voltage VCORE with the sum of the first driving power and the second driving power as both the first driver 22<1> having the first driving power and the second driver 22<2> having the second driving power are activated when the mismatching cancellation operation is entered. The second driving power may be set as greater driving power that drives the internal voltage VCORE than the first driving power.

The voltage control circuit 21 may generate the high voltage driving signal HDRV that is disabled to a logic low level, after generating the low voltage driving signal LDRV and the high voltage driving signal HDRV that are enabled when the mismatching enable signal MCEN is enabled. The first driver 22<1> of the voltage supply circuit 22 may be activated when the low voltage driving signal LDRV is enabled to a logic high level, and may drive the internal voltage VCORE with the first driving power by being supplied with the source voltage VDD. When the high voltage driving signal HDRV is disabled to a logic low level, the first driver 22<1> of the voltage supply circuit 22 may be deactivated. The voltage supply circuit 22 may drive the internal voltage VCORE with the first driving power as the first driver 22<1> having the first driving power is activated in the mismatching cancellation operation.

The mismatching cancellation operation step S3 may be set as a step of driving the bit line BL and the inverted bit line BLB at the same voltage level by being supplied with the internal voltage VCORE. The sense amplifier 30 may drive the bit line BL and the inverted bit line BLB at the same voltage level by being supplied with the internal voltage VCORE that is driven with the sum of the first driving power and the second driving power based on the first operation pulse SAP1 and the third operation pulse SAN when the mismatching cancellation operation is entered. The sense amplifier 30 may drive the bit line BL and the inverted bit line BLB at the same voltage level by being supplied with the internal voltage VCORE that is driven with the first driving power based on the first operation pulse SAP1 and the third operation pulse SAN in the mismatching cancellation operation.

The second internal voltage supply step S4 may be set as a step of supplying the internal voltage VCORE by selectively activating the first driver 22<1> having the first driving power and the second driver 22<2> having the second driving power after the start of a sensing operation.

In the second internal voltage supply step S4, the operation control circuit 10 may generate the sensing enable signal SAEN after generating the mismatching enable signal MCEN when the active command ACT is enabled and the precharge command PCG is disabled. The operation control circuit 10 may generate the second operation pulse SAP2 and the third operation pulse SAN when the active command ACT is enabled and the sensing enable signal SAEN is enabled. The voltage control circuit 21 may generate the low voltage driving signal LDRV and the high voltage driving signal HDRV that are enabled to a logic high level when the voltage level of the internal voltage VCORE is lower than the voltage level of the reference voltage VREF, when the sensing enable signal SAEN is enabled and a sensing operation is entered. The first driver 22<1> of the voltage supply circuit 22 may be activated when the low voltage driving signal LDRV is enabled to a logic high level, and may drive the internal voltage VCORE with the first driving power by being supplied with the source voltage VDD. The second driver 22<2> of the voltage supply circuit 22 may be activated when the high voltage driving signal HDRV is enabled to a logic high level, and may drive the internal voltage VCORE with the second driving power by being supplied with the source voltage VDD. The voltage supply circuit 22 may drive the internal voltage VCORE with the sum of the first driving power and the second driving power as both the first driver 22<1> having the first driving power and the second driver 22<2> having the second driving power are activated when the sensing operation is entered.

The voltage control circuit 21 may generate the high voltage driving signal HDRV that is disabled to a logic low level, after generating the low voltage driving signal LDRV and the high voltage driving signal HDRV that are enabled when the sensing enable signal SAEN is enabled. The first driver 22<1> of the voltage supply circuit 22 may be activated when the low voltage driving signal LDRV is enabled to a logic high level, and may drive the internal voltage VCORE with the first driving power by being supplied with the source voltage VDD. When the high voltage driving signal HDRV is disabled to a logic low level, the first driver 22<1> of the voltage supply circuit 22 may be deactivated. The voltage supply circuit 22 may drive the internal voltage VCORE with the first driving power as the first driver 22<1> having the first driving power is activated in the sensing operation The sensing operation step S5 may be set as a step of detecting and amplifying a difference between the voltage levels of the bit line BL and the inverted bit line BLB by being supplied with the internal voltage VCORE.

In the sensing operation step S5, the sense amplifier 30 may detect and amplify a difference between the voltage levels of the bit line BL and the inverted bit line BLB by being supplied with the internal voltage VCORE that is driven with the sum of the first driving power and the second driving power based on the second operation pulse SAP2 and the third operation pulse SAN when the sensing operation is entered, may store the data DATA that have been loaded onto the bit line BL, and may output the stored data DATA to the bit line BL. The sense amplifier 30 may detect and amplify a difference between the voltage levels of the bit line BL and the inverted bit line BLB by being supplied with the internal voltage VCORE that is driven with the first driving power based on the second operation pulse SAP2 and the third operation pulse SAN in the sensing operation, may store the data DATA that have been loaded onto the bit line BL, and may output the stored data DATA to the bit line BL.

As described above, the voltage generation method according to an embodiment of the present disclosure can rapidly raise the voltage level of the internal voltage VCORE by driving the internal voltage VCORE with the sum of the first driving power and the second driving power when a mismatching cancellation operation and a sensing operation are entered. In an embodiment, the voltage generation method can prevent or mitigate an error of a sensing operation because an overcharging phenomenon in which the internal voltage VCORE is generated to have a higher voltage level than a target level does not occur when the sensing operation is entered, by driving the internal voltage VCORE with the first driving power in a mismatching cancellation operation before the sensing operation is entered. In an embodiment, the voltage generation method can prevent or mitigate an error of a next sensing operation because an overcharging phenomenon in which the internal voltage VCORE is generated to have a higher voltage level than a target level does not occur when the next sensing operation is entered, by driving the internal voltage VCORE with the first driving power in a sensing operation. In an embodiment, the voltage generation method can prevent or mitigate an error of a sensing operation that is performed in another adjacent sense amplifier because an overcharging phenomenon in which the internal voltage VCORE is generated to have a higher voltage level than a target level does not occur when the another adjacent sense amplifier enters the sensing operation, by driving the internal voltage VCORE with the first driving power in the sensing operation.

Figure 10:
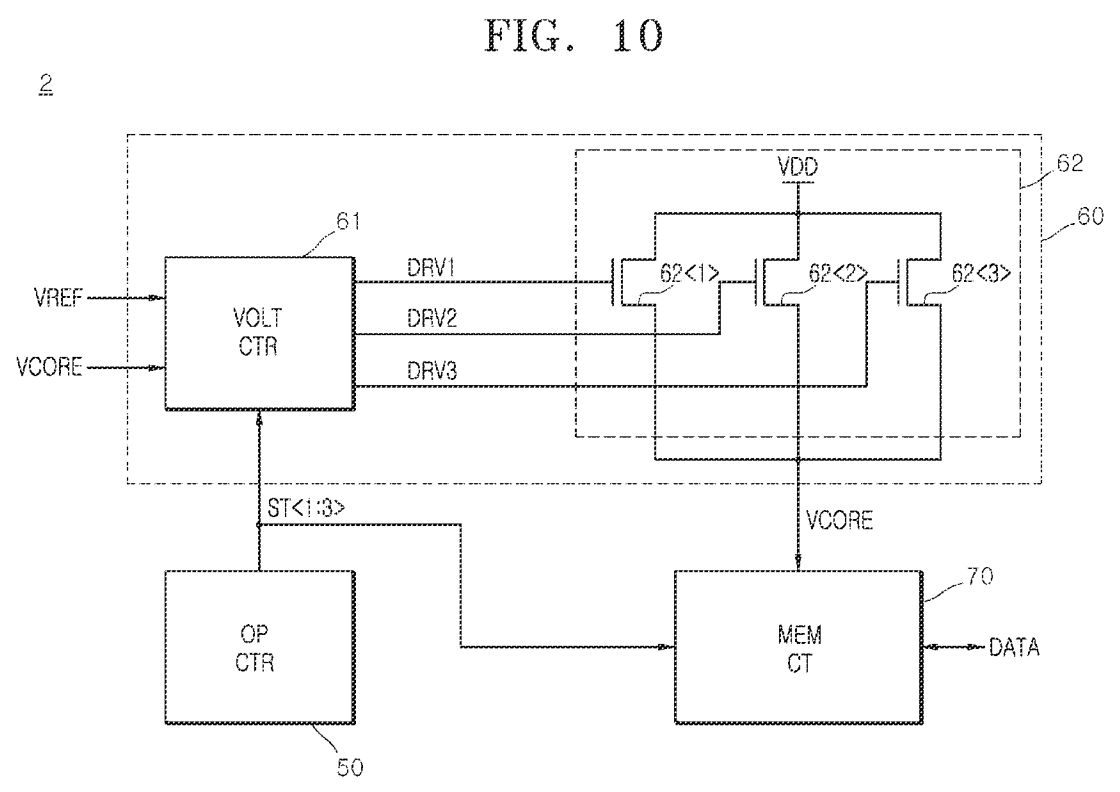

FIG. 10 is a block diagram illustrating a construction of a semiconductor device 2 according to another embodiment of the present disclosure. As illustrated in FIG. 10, the semiconductor device 2 according to another embodiment of the present disclosure may include an operation control circuit (OP CTR) 50, a voltage generation circuit 60, and a memory circuit (MEM CT) 70.

The operation control circuit 50 may generate first to third operation information signals ST<1:3> including consumption information of an internal current that is used in the memory circuit 70. The operation control circuit 50 may generate the first operation information signal ST<1> that is enabled when the consumption of the internal current that is used in the memory circuit 70 is a first consumption amount. The operation control circuit 50 may generate the second operation information signal ST<2> that is enabled when the consumption of the internal current that is used in the memory circuit 70 is a second consumption amount. The operation control circuit 50 may generate the third operation information signal ST<3> that is enabled when the consumption amount of the internal current that is used in the memory circuit 70 is a third consumption amount.

The third consumption amount may mean a case in which the consumption of the internal current that is used in the memory circuit 70 is greater than the second consumption amount. The second consumption amount may mean a case in which the consumption of the internal current that is used in the memory circuit 70 is greater than the first consumption amount. For example, third consumption amount may indicate that more internal current is consumed in the memory circuit 70 than what is consumed with the second consumption amount and first consumption amount may indicate that less internal current is consumed in the memory circuit 70 than what is consumed with the second consumption amount.

The voltage generation circuit 60 may include a voltage control circuit (VOLT CTR) 61 and a voltage supply circuit 62.

The voltage control circuit 61 may generate first to third voltage driving signals DRV1, DRV2, and DRV3 based on the first to third operation information signals ST<1:3> by comparing a reference voltage VREF and an internal voltage VCORE. The voltage control circuit 61 may generate the first to third voltage driving signals DRV1, DRV2, and DRV3 based on the first to third operation information signals ST<1:3> when the voltage level of the internal voltage VCORE is lower than the voltage level of the reference voltage VREF. The voltage control circuit 61 may generate the first voltage driving signal DRV1 that is enabled, when the voltage level of the internal voltage VCORE is lower than the voltage level of the reference voltage VREF and the first operation information signal ST<1> is enabled. The voltage control circuit 61 may generate the first voltage driving signal DRV1 and the second voltage driving signal DRV2 that are enabled, when the voltage level of the internal voltage VCORE is lower than the voltage level of the reference voltage VREF and the second operation information signal ST<2> is enabled. The voltage control circuit 61 may generate the first voltage driving signal DRV1 and the third voltage driving signal DRV3 that are enabled, when the voltage level of the internal voltage VCORE is lower than the voltage level of the reference voltage VREF and the third operation information signal ST<3> is enabled.

The voltage supply circuit 62 may include a first driver 62<1> having first driving power, a second driver 62<2> having second driving power, and a third driver 62<3> having third driving power. The first driver 62<1> may be implemented as an NMOS transistor. The first driver 62<1> may be activated when the first voltage driving signal DRV1 is enabled to a logic high level, and may drive the internal voltage VCORE with the first driving power by being supplied with a source voltage VDD. The second driver 62<2> may be implemented as an NMOS transistor. The second driver 62<2> may be activated when the second voltage driving signal DRV2 is enabled to a logic high level, and may drive the internal voltage VCORE with the second driving power by being supplied with the source voltage VDD. The third driver 62<3> may be activated when the third voltage driving signal DRV3 is enabled to a logic high level, and may drive the internal voltage VCORE with the third driving power by being supplied with the source voltage VDD. The third driving power may be set as greater driving power that drives the internal voltage VCORE than the second driving power. The second driving power may be set as greater driving power that drives the internal voltage VCORE than the first driving power. The third driver 62<3> may be implemented as an NMOS transistor having a larger size than the NMOS transistor of the second driver 62<2>. The second driver 62<2> may be implemented as an NMOS transistor having a larger size than the NMOS transistor of the first driver 62<1>. The first driver 62<1>, the second driver 62<2>, and the third driver 62<3> may each be implemented as a PMOS transistor according to an embodiment.

The memory circuit 70 may be implemented as a memory circuit including a plurality of memory cells (32 in FIG. 4). The memory circuit 70 may input and output data DATA by being supplied with the internal voltage VCORE. The memory circuit 70 may have the consumption amount of an internal current therein adjusted based on the first to third operation information signals ST<1:3>, and may input and output the data DATA by being supplied with the internal voltage VCORE. The memory circuit 70 may input and output the data DATA by performing an operation using the internal current that is being consumed with the first consumption amount when the first operation information signal ST<1> is enabled. The memory circuit 70 may input and output the data DATA by performing an operation using the internal current that is being consumed with the second consumption amount when the second operation information signal ST<2> is enabled. The memory circuit 70 may input and output the data DATA by performing an operation using the internal current that is being consumed with the third consumption amount when the third operation information signal ST<3> is enabled.

The memory circuit 70 may include the aforementioned sense amplifier 30, and may be implemented to input and output the data DATA. The memory circuit 70 may drive the bit line BL and the inverted bit line BLB at the same voltage level by being supplied with the internal voltage VCORE in a mismatching cancellation operation. The memory circuit 70 may detect and amplify a difference between the voltage levels of the bit line BL and the inverted bit line BLB by being supplied with the internal voltage VCORE in a sensing operation. The memory circuit 70 may detect and amplify a difference between the voltage levels of the bit line BL and the inverted bit line BLB by being supplied with the internal voltage VCORE in a sensing operation, and may store the data DATA that have been loaded onto the bit line BL or may output the stored data DATA to the bit line BL.

The semiconductor device 2 may rapidly raise the voltage level of the internal voltage VCORE by selectively driving the internal voltage VCORE with the first driving power, the second driving power, and the third driving power based on the consumption amount of an internal current that is used in the memory circuit 70. The semiconductor device 2 may have driving power that drives the internal voltage VCORE adjusted based on the consumption amount of the internal current, and may supply the internal voltage VCORE to the memory circuit 70 by stably generating the internal voltage VCORE. The semiconductor device 2 may supply the internal voltage VCORE to the memory circuit 70 by driving the internal voltage VCORE with the first driving power when the consumption amount of the internal current is the first consumption amount. The semiconductor device 2 may supply the internal voltage VCORE to the memory circuit 70 by driving the internal voltage VCORE with the sum of the first driving power and the second driving power when the consumption amount of the internal current is the second consumption amount. The semiconductor device 2 may supply the internal voltage VCORE to the memory circuit 70 by driving the internal voltage VCORE with the sum of the first driving power and the third driving power when the consumption amount of the internal current is the third consumption amount.

Figure 11:
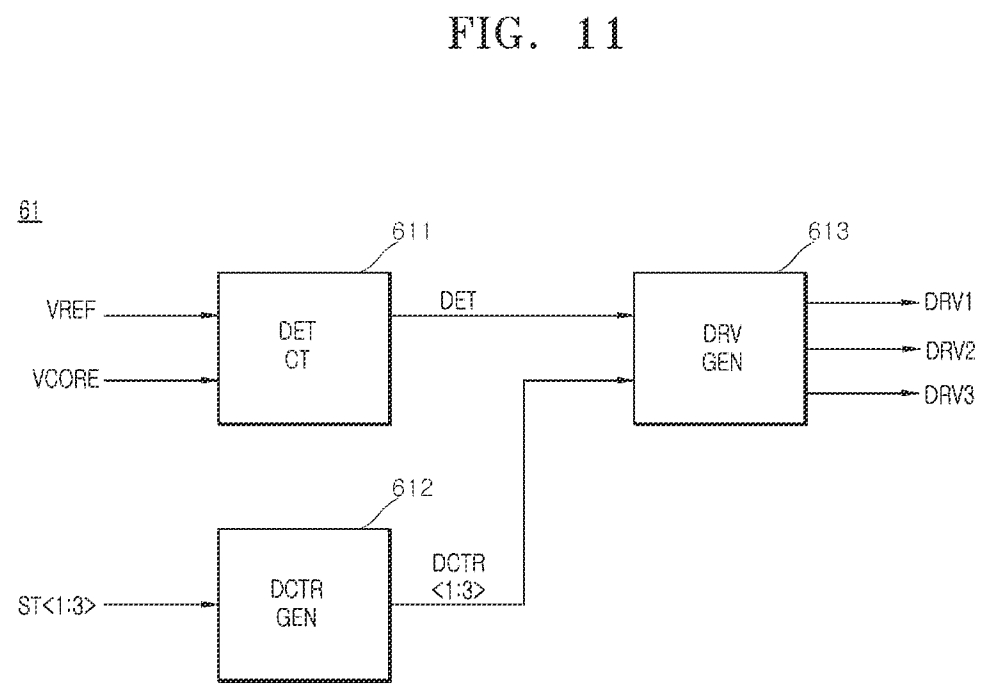

FIG. 11 is a block diagram illustrating a construction according to an embodiment of the voltage control circuit 61 that is included in the voltage generation circuit 60. The voltage control circuit 61 may include a detection circuit (DET CT) 611, a driving control signal generation circuit (DCTR GEN) 612, and a driving signal generation circuit (DRV GEN) 613.

The detection circuit 611 may generate a detection signal DET by comparing the reference voltage VREF and the internal voltage VCORE. The detection circuit 611 may generate the detection signal DET that is enabled to a logic high level when the voltage level of the internal voltage VCORE is lower than the voltage level of the reference voltage VREF. The detection circuit 611 may generate the detection signal DET that is disabled to a logic low level when the voltage level of the internal voltage VCORE is identical with or higher than the voltage level of the reference voltage VREF. The detection circuit 611 may be implemented as a common comparator.

The driving control signal generation circuit 612 may generate first to third driving control signals DCTR<1:3> based on the first to third operation information signals ST<1:3>. The driving control signal generation circuit 612 may generate the first driving control signal DCTR<1> that is enabled when the first operation information signal ST<1> is enabled. The driving control signal generation circuit 612 may generate the first driving control signal DCTR<1> and the second driving control signal DCTR<2> that are enabled when the second operation information signal ST<2> is enabled. The driving control signal generation circuit 612 may generate the first driving control signal DCTR<1> and the third driving control signal DCTR<3> that are enabled when the third operation information signal ST<3> is enabled.

The driving signal generation circuit 613 may generate a first driving signal DRV1, a second driving signal DRV2, and a third driving signal DRV3, based on the detection signal DET and the first to third driving control signals DCTR<1:3>. The driving signal generation circuit 613 may generate the first driving signal DRV1, the second driving signal DRV2, and the third driving signal DRV3 by buffering the first to third driving control signals DCTR<1:3> during an interval in which the detection signal DET is enabled.

Figure 12:
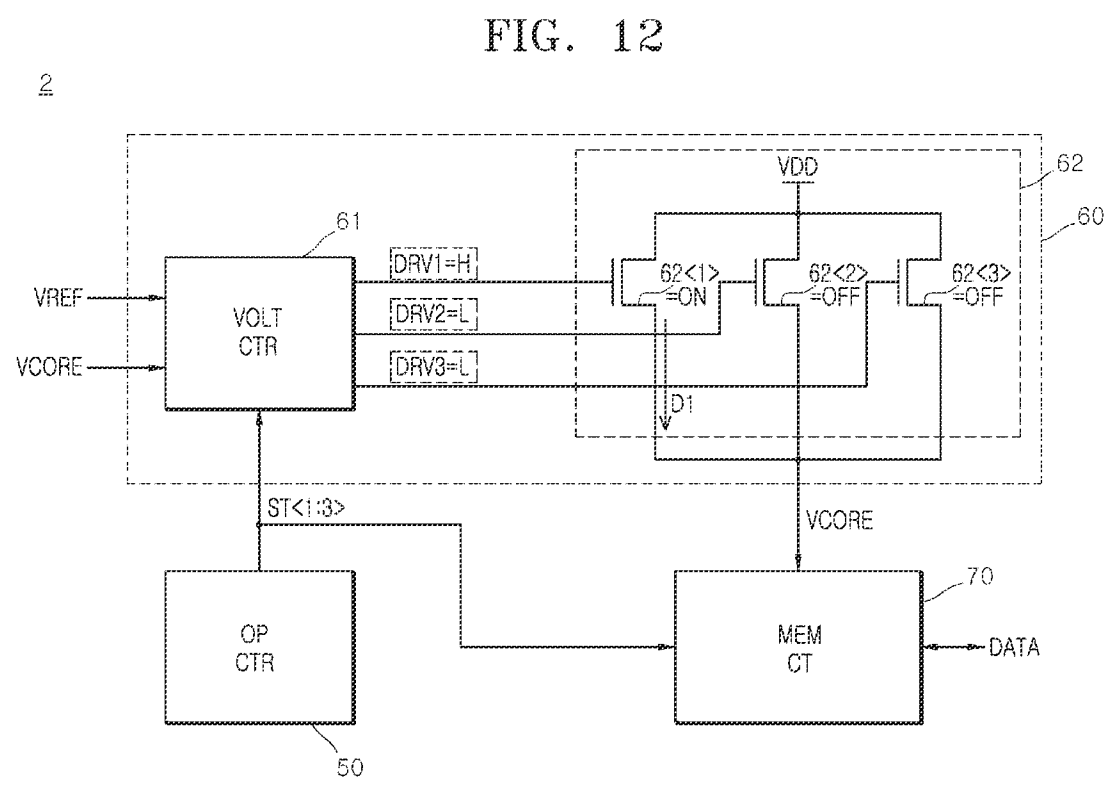
Figure 13:
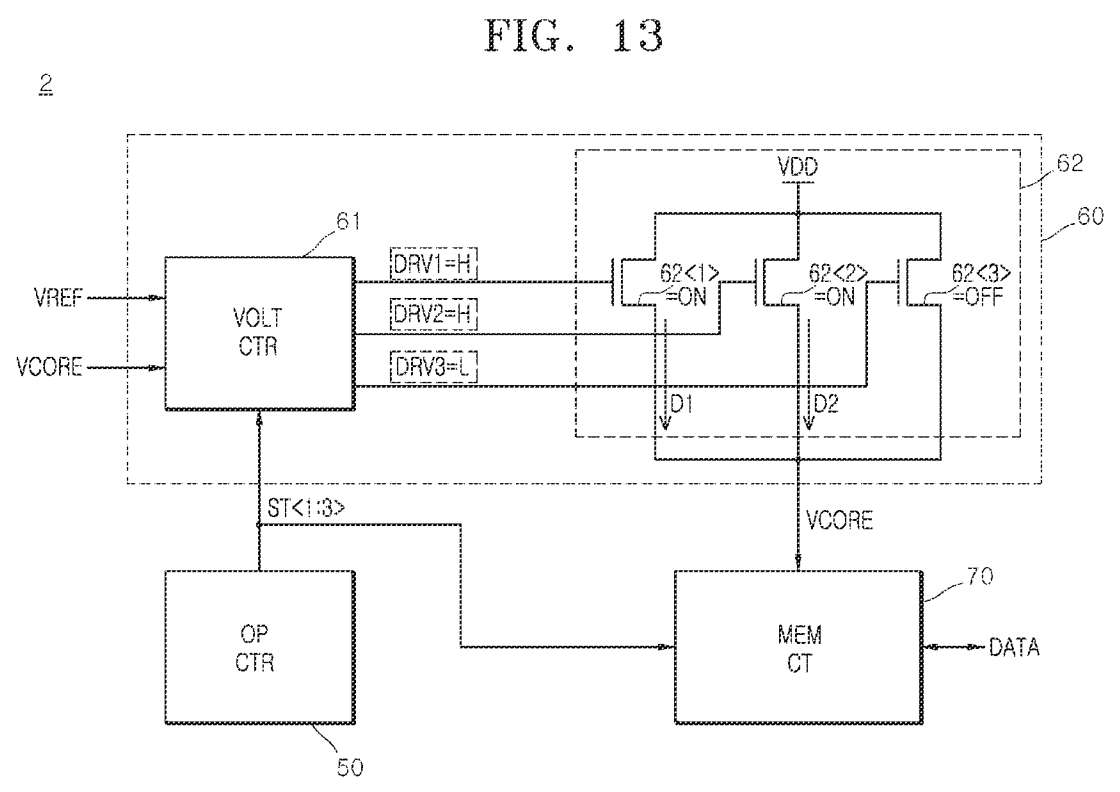
Figure 14:
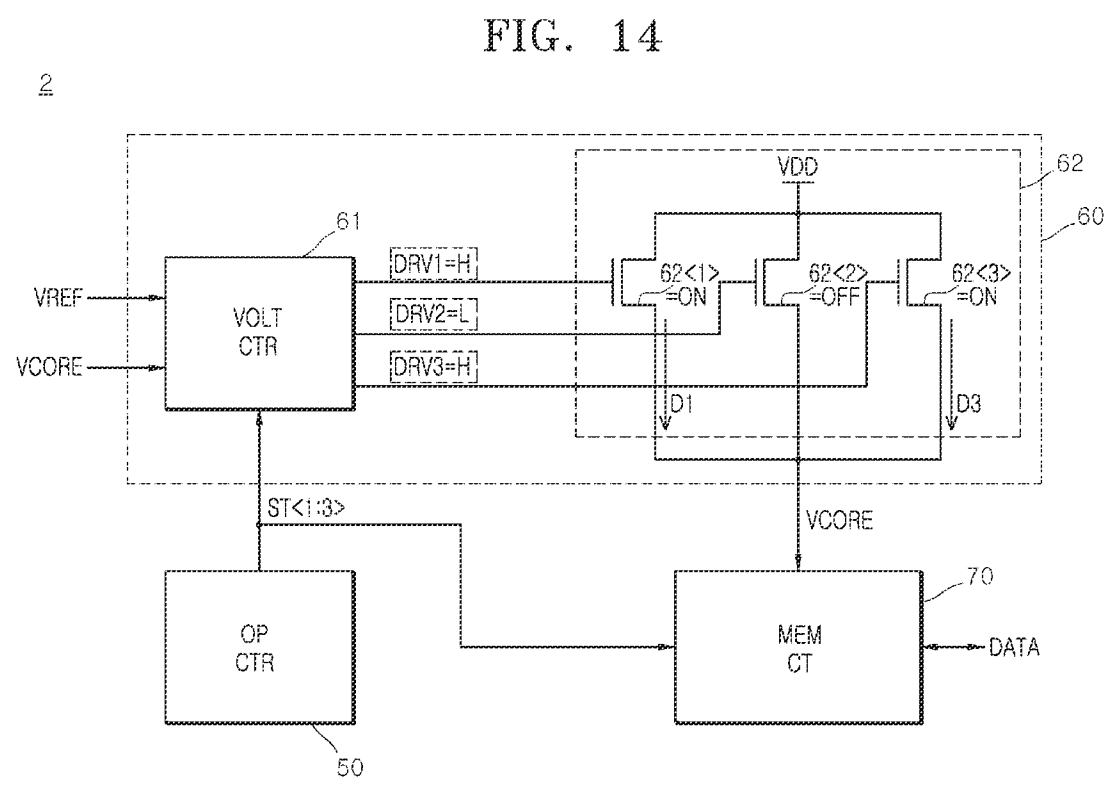

FIGS. 12 to 14 are diagrams for describing an operation of the semiconductor device 2 according to another embodiment of the present disclosure.

First, an operation of the semiconductor device 2 according to another embodiment of the present disclosure will be described with reference to FIG. 12. In this case, an operation of supplying the internal voltage VCORE to the memory circuit 70 by driving the internal voltage VCORE with the first driving power D1 when the consumption amount of an internal current that is used in the memory circuit 70 is the first consumption amount will be described as follows as an example.

The operation control circuit 50 may generate the first operation information signal ST<1> that is enabled to a logic high level, the second operation information signal ST<2> that is disabled to a logic low level, and the third operation information signal ST<3> that is disabled to a logic low level when the consumption amount of an internal current that is used in the memory circuit 70 is the first consumption amount.

The voltage control circuit 61 of the voltage generation circuit 60 may generate the first voltage driving signal DRV1 that is enabled to a logic high level H, the second voltage driving signal DRV2 that is disabled to a logic low level L, and the third voltage driving signal DRV3 that is disabled to a logic low level L, based on the first to third operation information signals ST<1:3>, when the voltage level of the internal voltage VCORE is lower than the voltage level of the reference voltage VREF.

The voltage supply circuit 62 of the voltage generation circuit 60 may drive the internal voltage VCORE with the first driving power D1 by being supplied with the source voltage VDD as the first driver 62<1> is activated (ON) when the first voltage driving signal DRV1 is enabled to the logic high level H. The second driver 62<2> of the voltage supply circuit 62 may be deactivated (OFF) when the second voltage driving signal DRV2 is disabled to the logic low level L. When the third voltage driving signal DRV3 is disabled to the logic low level L, the third driver 62<3> of the voltage supply circuit 62 may be deactivated (OFF). The voltage supply circuit 62 may drive the internal voltage VCORE with the first driving power D1 when the first voltage driving signal DRV1 is enabled to the logic high level H.

The memory circuit 70 may input and output the data DATA by being supplied with the internal voltage VCORE that has been driven with the first driving power D1 by performing an operation of an internal current being consumed as the first consumption amount when the first operation information signal ST<1> is enabled.

Next, an operation of the semiconductor device 2 according to another embodiment of the present disclosure will be described with reference to FIG. 13. In this case, an operation of supplying the internal voltage VCORE to the memory circuit 70 by driving the internal voltage VCORE with the sum of the first driving power D1 and the second driving power D2 when the consumption amount of the internal current that is used in the memory circuit 70 is the second consumption amount will be described as follows as an example.

The operation control circuit 50 may generate the first operation information signal ST<1> that is disabled to a logic low level, the second operation information signal ST<2> that is enabled to a logic high level, and the third operation information signal ST<3> that is disabled to a logic low level, when the consumption amount of an internal current that is used in the memory circuit 70 is the second consumption amount.

The voltage control circuit 61 of the voltage generation circuit 60 may generate the first voltage driving signal DRV1 that is enabled to a logic high level H, the second voltage driving signal DRV2 that is enabled to a logic high level H, and the third voltage driving signal DRV3 that is disabled to a logic low level L, based on the first to third operation information signals ST<1:3>, when the voltage level of the internal voltage VCORE is lower than the voltage level of the reference voltage VREF.

The voltage supply circuit 62 of the voltage generation circuit 60 may drive the internal voltage VCORE with the first driving power D1 by being supplied with the source voltage VDD as the first driver 62<1> is activated (ON) when the first voltage driving signal DRV1 is enabled to the logic high level H. The voltage supply circuit 62 may drive the internal voltage VCORE with the second driving power D2 by being supplied with the source voltage VDD as the second driver 62<2> is activated (ON) when the second voltage driving signal DRV2 is enabled to the logic high level H. When the third voltage driving signal DRV3 is disabled to the logic low level L, the third driver 62<3> of the voltage supply circuit 62 may be deactivated (OFF). The voltage supply circuit 62 may drive the internal voltage VCORE with the sum of the first driving power D1 and the second driving power D2, when the first voltage driving signal DRV1 is enabled to the logic high level H and the second voltage driving signal DRV2 is enabled to the logic high level H.

The memory circuit 70 may input and output the data DATA by being supplied with the internal voltage VCORE that has been driven with the sum of the first driving power D1 and the second driving power D2 by performing an operation of the internal current being consumed as the second consumption amount when the second operation information signal ST<2> is enabled.

Next, an operation of the semiconductor device 2 according to another embodiment of the present disclosure will be described with reference to FIG. 14. In this case, an operation of supplying the internal voltage VCORE to the memory circuit 70 by driving the internal voltage VCORE with the sum of the first driving power D1 and the third driving power D3 when the consumption amount of an internal current that is used in the memory circuit 70 is the third consumption amount will be described as follows as an example.

The operation control circuit 50 may generate the first operation information signal ST<1> that is disabled to a logic low level, the second operation information signal ST<2> that is disabled to a logic low level, and the third operation information signal ST<3> that is enabled to a logic high level, when the consumption amount of an internal current that is used in the memory circuit 70 is the third consumption amount.

The voltage control circuit 61 of the voltage generation circuit 60 may generate the first voltage driving signal DRV1 that is enabled to a logic high level H, the second voltage driving signal DRV2 that is disabled to a logic low level L, and the third voltage driving signal DRV3 that is enabled to a logic high level H, based on the first to third operation information signals ST<1:3>, when the voltage level of the internal voltage VCORE is lower than the voltage level of the reference voltage VREF.

The voltage supply circuit 62 of the voltage generation circuit 60 may drive the internal voltage VCORE with the first driving power D1 by being supplied with the source voltage VDD as the first driver 62<1> is activated (ON) when the first voltage driving signal DRV1 is enabled to the logic high level H. When the second voltage driving signal DRV2 is disabled to the logic low level L, the second driver 62<2> of the voltage supply circuit 62 may be deactivated (OFF). The voltage supply circuit 62 may drive the internal voltage VCORE with the third driving power D3 by being supplied with the source voltage VDD as the third driver 62<3> is activated (ON) when the third voltage driving signal DRV3 is enabled to the logic high level H. The voltage supply circuit 62 may drive the internal voltage VCORE with the sum of the first driving power D1 and the third driving power D3, when the first voltage driving signal DRV1 is enabled to the logic high level H and the third voltage driving signal DRV3 is enabled to the logic high level H.

The memory circuit 70 may input and output the data DATA by being supplied with the internal voltage VCORE that has been driven with the sum of the first driving power D1 and the third driving power D3 by performing an operation of the internal current being consumed as the third consumption amount when the third operation information signal ST<3> is enabled.

As described above, in an embodiment, the semiconductor device 2 according to another embodiment of the present disclosure can rapidly raise the voltage level of the internal voltage VCORE by selectively driving the internal voltage VCORE with the first driving power, the second driving power, and the third driving power based on the consumption amount of an internal current that is used in the memory circuit 70. The semiconductor device 2, in an embodiment, can have driving power that drives the internal voltage VCORE adjusted based on the consumption amount of the internal current, and can supply the internal voltage VCORE to the memory circuit 70 stably generating the internal voltage VCORE. The semiconductor device 2 can supply the internal voltage VCORE to the memory circuit 70 by driving the internal voltage VCORE with the first driving power when the consumption amount of the internal current is the first consumption amount. The semiconductor device 2 can supply the internal voltage VCORE to the memory circuit 70 by driving the internal voltage VCORE with the sum of the first driving power and the second driving power when the consumption amount of the internal current is the second consumption amount. The semiconductor device 2 can supply the internal voltage VCORE to the memory circuit 70 by driving the internal voltage VCORE with the sum of the first driving power and the third driving power when the consumption amount of the internal current is the third consumption amount.

Figure 15:
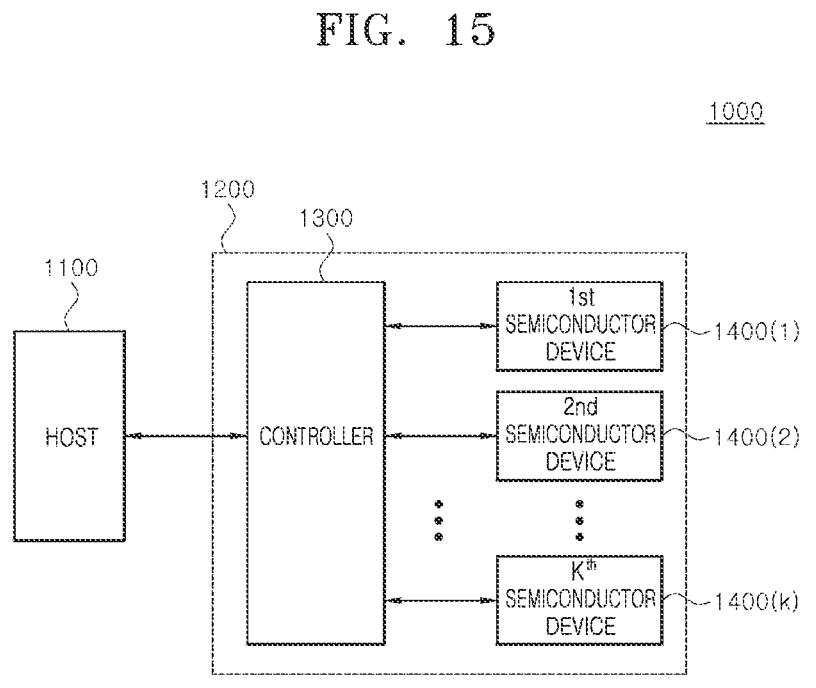

FIG. 15 is a block diagram illustrating a construction according to an embodiment of an electronic system 1000 to which the semiconductor device according to an embodiment of the present disclosure has been applied. As illustrated in FIG. 15, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) so that the semiconductor devices 1400(K:1) each perform an active operation, a mismatching cancellation operation, a sensing operation, and a precharge operation. The semiconductor devices 1400(K:1), in an embodiment, may each rapidly raise the voltage level of the internal voltage VCORE by driving the internal voltage VCORE with the sum of the first driving power and the second driving power when a mismatching cancellation operation and a sensing operation are entered. In an embodiment, the semiconductor devices 1400(K:1) can each prevent or mitigate an error of a sensing operation because an overcharging phenomenon in which the internal voltage VCORE is generated to have a higher voltage level than a target level does not occur when the sensing operation is entered, by driving the internal voltage VCORE with the first driving power in a mismatching cancellation operation before the sensing operation is entered. In an embodiment, the semiconductor devices 1400

US 12,573,433 B2

(K:1) can each prevent or mitigate an error of a next sensing operation because an overcharging phenomenon in which the internal voltage VCORE is generated to have a higher voltage level than a target level does not occur when the next sensing operation is entered by driving the internal voltage VCORE with the first driving power in a sensing operation. In an embodiment, the semiconductor devices 1400(K:1) can each prevent or mitigate an error of a sensing operation that is performed in another adjacent sense amplifier because an overcharging phenomenon in which the internal voltage VCORE is generated to have a higher voltage level than a target level does not occur when the another adjacent sense amplifier enters the sensing operation, by driving the internal voltage VCORE with the first driving power in the sensing operation. The semiconductor devices 1400(K:1), in an embodiment, can each rapidly raise the voltage level of the internal voltage VCORE by selectively driving the internal voltage VCORE with the first driving power, the second driving power, and the third driving power based on the consumption amount of an internal current that is used in a the memory circuit. The semiconductor devices 1400 (K:1), in an embodiment, can have driving power that drives the internal voltage VCORE adjusted based on the consumption amount of the internal current, and can supply the internal voltage VCORE to the memory circuit by stably generating the internal voltage VCORE.

The semiconductor devices 1400(K:1) may each be implemented as the semiconductor device 1 illustrated in FIG. 1 or the semiconductor device 2 illustrated in FIG. 10. The semiconductor devices 1400(K:1) may each be implemented as one of dynamic random access memory (DRAM), phase change random access memory (PRAM), resistive random access memory (RRAM), magnetic random access memory (MRAM), and ferroelectric random access memory (FRAM) according to an embodiment.

What is claimed is:

1. A voltage generation circuit comprising:
a voltage control circuit configured to receive a reference voltage and an internal voltage, compare the reference voltage to the internal voltage to generate a high voltage driving signal and a low voltage driving signal, after a start of a mismatching cancellation operation and a sensing operation, and to disable the high voltage driving signal based on the comparison of the reference voltage with the internal voltage; and
a voltage supply circuit comprising a first driver having a first driving power and a second driver having a second driving power and configured to drive the internal voltage by selectively activating the first driver and the second driver based on the low voltage driving signal and the high voltage driving signal.

2. The voltage generation circuit of claim 1, wherein the voltage supply circuit is configured to:
activate both the first driver and the second driver based on the low voltage driving signal and the high voltage driving signal that are enabled when the mismatching cancellation operation and the sensing operation are entered, and
drive the internal voltage with a sum of the first driving power and the second driving power.

3. The voltage generation circuit of claim 1, wherein the voltage supply circuit is configured to drive the internal voltage with the first driving power when the low voltage driving signal is enabled in the mismatching cancellation operation and the sensing operation.

4. The voltage generation circuit of claim 1, wherein the voltage control circuit comprises:

a detection circuit configured to receive the reference voltage and the internal voltage to generate a detection signal that is enabled when a voltage level of the internal voltage is lower than a voltage level of the reference voltage;
a driving control signal generation circuit configured to receive a mismatching enable signal and a sensing enable signal to generate a driving control signal that is enabled for a first interval based on the mismatching enable signal that is enabled when the mismatching cancellation operation is entered and that is enabled for a second interval based on the sensing enable signal that is enabled when the sensing operation is entered; and
a driving signal generation circuit configured to receive the detection signal to generate the low voltage driving signal that is enabled when the detection signal is enabled and configured to receive the driving control signal to generate the high voltage driving signal by buffering the driving control signal during an interval in which the detection signal is enabled.

5. The voltage generation circuit of claim 1, wherein the voltage supply circuit comprises:
the first driver activated when the low voltage driving signal is enabled and configured to drive the internal voltage with the first driving power; and
the second driver activated when the high voltage driving signal is enabled and configured to drive the internal voltage with the second driving power.

6. The voltage generation circuit of claim 1, further comprising a sense amplifier configured to generate a first supply voltage by being supplied with the internal voltage when a first operation pulse is enabled after the start of the mismatching cancellation operation, configured to generate a second supply voltage by being supplied with a ground voltage when a third operation pulse is enabled, and configured to drive a bit line and an inverted bit line at an identical voltage level based on the first supply voltage and the second supply voltage when a mismatching enable signal that is enabled when the mismatching cancellation operation is entered is input.

7. The voltage generation circuit of claim 1, further comprising a sense amplifier configured to generate a first supply voltage by being supplied with the internal voltage when a second operation pulse is enabled after the start of the sensing operation, configured to generate a second supply voltage by being supplied with a ground voltage when a third operation pulse is enabled, and configured to detect and amplify a difference between voltage levels of a bit line and an inverted bit line based on the first supply voltage and the second supply voltage after the start of the sensing operation.

8. A semiconductor device comprising:
a voltage supply circuit configured to drive an internal voltage with a first driving power, after driving the internal voltage with a sum of the first driving power and a second driving power after a start of a mismatching cancellation operation and a sensing operation; and
a sense amplifier configured to drive a bit line and an inverted bit line at an identical voltage level by being supplied with the internal voltage in the mismatching cancellation operation and configured to detect and amplify a difference between the voltage levels of the bit line and the inverted bit line by being supplied with the internal voltage in the sensing operation.

9. The semiconductor device of claim 8, wherein the voltage supply circuit is configured to drive the internal voltage with the sum of the first driving power and the second driving power or to drive the internal voltage with the first driving power when a voltage level of the internal voltage is lower than a voltage level of a reference voltage.

10. The semiconductor device of claim 8, wherein the voltage supply circuit is configured to drive the internal voltage with the sum of the first driving power and the second driving power when the mismatching cancellation operation and the sensing operation are entered.

11. The semiconductor device of claim 8, wherein the voltage supply circuit comprises:

a first driver activated when a low voltage driving signal is enabled after the start of the mismatching cancellation operation and the sensing operation and configured to drive the internal voltage with the first driving power; and a second driver activated when a high voltage driving signal is enabled after the start of the mismatching cancellation operation and the sensing operation and configured to drive the internal voltage with the second driving power.

12. The semiconductor device of claim 8, wherein the sense amplifier comprises:

a supply voltage generation circuit configured to generate a first supply voltage by being supplied with the internal voltage when a first operation pulse and a second operation pulse are enabled and configured to generate a second supply voltage by being supplied with a ground voltage when a third operation pulse is enabled;

a memory cell connected to a word line and a bit line and configured to store data that has been loaded onto the bit line; and an amplification circuit configured to drive the bit line and the inverted bit line at the identical voltage level based on the first supply voltage and the second supply voltage when a mismatching enable signal is input after the start of the mismatching cancellation operation and configured to detect and amplify a difference between the voltage levels of the bit line and the inverted bit line based on the first supply voltage and the second supply voltage in the sensing operation.

13. The semiconductor device of claim 12, wherein:

the supply voltage generation circuit is configured to generate the first supply voltage by being supplied with the internal voltage when the first operation pulse is enabled after the start of the mismatching cancellation operation, the supply voltage generation circuit is configured to generate the first supply voltage by being supplied with the internal voltage when the second operation pulse is enabled after the start of the sensing operation, and the supply voltage generation circuit is configured to generate the second supply voltage by being supplied with the ground voltage when the third operation pulse is enabled after the start of the mismatching cancellation operation and the sensing operation.

14. The semiconductor device of claim 12, wherein the amplification circuit comprises:

a first connection element disposed between the bit line and a bit line sense amplifier and activated when the mismatching enable signal is input;

a second connection element disposed between the inverted bit line and the bit line sense amplifier and activated when the mismatching enable signal is input; and a bit line sense amplifier configured to drive the bit line and the inverted bit line at the identical voltage level by being supplied with the first supply voltage and the second supply voltage in the mismatching cancellation operation and configured to detect and amplify the difference between the voltage levels of the bit line and the inverted bit line by being supplied with the first supply voltage and the second supply voltage in the sensing operation.

15. A voltage generation method comprising:

supplying an internal voltage by selectively activating a first driver having a first driving power and a second driver having a second driving power after a start of a mismatching cancellation operation;

driving a bit line and an inverted bit line at an identical voltage level by being supplied with the internal voltage;

supplying the internal voltage by selectively activating the first driver and the second driver after a start of a sensing operation; and detecting and amplifying a difference between the voltage levels of the bit line and the inverted bit line by being supplied with the internal voltage.

16. The voltage generation method of claim 15, wherein the second driving power is greater than the first driving power.

17. The voltage generation method of claim 15, wherein supplying the internal voltage by selectively activating the first driver having the first driving power and the second driver having the second driving power after the start of the mismatching cancellation operation comprises driving the internal voltage when a voltage level of the internal voltage is lower than a voltage level of a reference voltage, and wherein supplying the internal voltage by selectively activating the first driver and the second driver after the start of the sensing operation comprises driving the internal voltage when a voltage level of the internal voltage is lower than a voltage level of a reference voltage.

18. The voltage generation method of claim 15, wherein the supplying the internal voltage by selectively activating the first driver having the first driving power and the second driver having the second driving power after the start of the mismatching cancellation operation comprises driving the internal voltage with the first driving power by activating the first driver, after driving the internal voltage with a sum of the first driving power and the second driving power by activating both the first driver and the second driver when the mismatching cancellation operation is entered.

19. The voltage generation method of claim 15, wherein supplying the internal voltage by selectively activating the first driver and the second driver after the start of the sensing operation comprises driving the internal voltage with the first driving power by activating the first driver, after driving the internal voltage with a sum of the first driving power and the second driving power by activating both the first driver and the second driver when the sensing operation is entered.

20. A semiconductor device comprising:

a voltage generation circuit comprising a first driver having a first driving power, a second driver having a second driving power, and a third driver having a third driving power and configured to receive first to third operation information signals and to adjust a driving power that drives an internal voltage by selectively activating the first to third drivers based on the first to third operation information signals; and a memory circuit configured to operate based on the first to third operation information signals, wherein the memory circuit is configured to perform a mismatching cancellation operation of driving a bit line and an inverted bit line at an identical voltage level by being supplied with the internal voltage and then perform a sensing operation of outputting data by detecting and amplifying a difference between the voltage levels of a bit line and an inverted bit line by being supplied with the internal voltage.

21. The semiconductor device of claim 20, wherein the first to third operation information signals comprise consumption information of an internal current that is used in the memory circuit.

22. The semiconductor device of claim 20, wherein:

the second driving power is greater than the first driving power, and the third driving power is greater than the second driving power.

23. The semiconductor device of claim 20, wherein:

the voltage generation circuit is configured to drive the internal voltage with the first driving power when an internal current that is used in the memory circuit is a first consumption amount, the voltage generation circuit is configured to drive the internal voltage with a sum of the first driving power and the second driving power when a consumption amount of the internal current that is used in the memory circuit is a second consumption amount, and the voltage generation circuit is configured to drive the internal voltage with a sum of the first driving power and the third driving power when the consumption amount of the internal current that is used in the memory circuit is a third consumption amount.

24. The semiconductor device of claim 20, wherein the voltage generation circuit comprises:

a voltage control circuit configured to generate first to third voltage driving signals that are selectively enabled based on the first to third operation information signals when a voltage level of the internal voltage is lower than a voltage level of a reference voltage; and a voltage supply circuit configured to drive the internal voltage with the first driving power as the first driver is activated when the first voltage driving signal is enabled, configured to drive the internal voltage with the second driving power as the second driver is activated when the second voltage driving signal is enabled, and configured to drive the internal voltage with the third driving power as the third driver is activated when the third voltage driving signal is enabled.

* * * * *